United States Patent
Lawson

(10) Patent No.: US 10,812,077 B2
(45) Date of Patent: Oct. 20, 2020

(54) TRIGGER CIRCUITRY FOR FAST, LOW-POWER STATE TRANSITIONS

(71) Applicant: CogniPower, LLC, Malvern, PA (US)

(72) Inventor: Thomas E. Lawson, Malvern, PA (US)

(73) Assignee: CogniPower, LLC, Malvern, PA (US)

( * ) Notice: Subject to any disclaimer, the term of this patent is extended or adjusted under 35 U.S.C. 154(b) by 0 days.

(21) Appl. No.: 16/740,908

(22) Filed: Jan. 13, 2020

(65) Prior Publication Data

US 2020/0153434 A1    May 14, 2020

Related U.S. Application Data

(63) Continuation of application No. 16/281,384, filed on Feb. 21, 2019, now Pat. No. 10,554,206.

(60) Provisional application No. 62/754,628, filed on Nov. 2, 2018, provisional application No. 62/635,584, filed on Feb. 27, 2018.

(51) Int. Cl.
*H03K 19/003* (2006.01)
*H03K 17/30* (2006.01)

(52) U.S. Cl.
CPC ....... *H03K 19/00307* (2013.01); *H03K 17/30* (2013.01); *H03K 19/00353* (2013.01)

(58) Field of Classification Search
CPC ........ H03K 17/10; H03K 17/12; H03K 17/30; H03K 17/567; H03K 17/60; H03K 17/164; H03K 17/668; H03K 19/00307; H03K 19/00353
See application file for complete search history.

(56) References Cited

U.S. PATENT DOCUMENTS 3,321,685 A    5/1967   Johannes
3,889,173 A    6/1975   Klusmann et al.
(Continued)

FOREIGN PATENT DOCUMENTS

EP    2717449 A1    4/2014

OTHER PUBLICATIONS

Frank, Richard et al. "LM3001/LM3101 A 1 MHz Off-Line PWM Controller Chipset with Pulse Communication for Voltage-Current- or Charge-Mode Control," National Semiconductor Application Note 918, Jan. 1994, pp. 1-8.
(Continued)

*Primary Examiner* — Nguyen Tran
(74) *Attorney, Agent, or Firm* — Mendelsohn Dunleavy, P.C.; Steve Mendelsohn

(57) ABSTRACT

An n-type transistor and a p-type transistor are connected in series such that, when the two transistors are turned on, current flows from the collector of the n-type transistor to the collector of the p-type transistor. A positive-feedback capacitor is connected between the collector of one transistor and the base of the other transistor. The two transistors turn on together when the base voltage of the n-type transistor exceeds the base voltage of the p-type transistor by at least the sum of the turn-on threshold voltages of the two transistors and (i) the two transistors turn off together when the base voltage of the n-type transistor fails to exceed the base voltage of the p-type transistor by at least that sum. The positive-feedback capacitor ensures that the two transistors turn fully on and off together. In certain embodiments, the circuitry can be controlled to operate as a current pulse generator.

14 Claims, 15 Drawing Sheets

(56) References Cited

U.S. PATENT DOCUMENTS

| | | | |
|---|---|---|---|
| 4,119,103 A | 10/1978 | Jirak | |
| 4,209,847 A | 6/1980 | Noda et al. | |
| 4,438,486 A | 3/1984 | Ferraro | |
| 4,459,651 A | 7/1984 | Fenter | |
| 4,597,036 A | 6/1986 | Paulik et al. | |
| 4,758,937 A | 7/1988 | Usui et al. | |
| 4,937,727 A | 6/1990 | Leonardi | |
| 4,958,268 A | 9/1990 | Nagagata et al. | |
| 4,996,638 A | 2/1991 | Orr | |
| 5,161,022 A | 11/1992 | Ichimura et al. | |
| 5,498,995 A | 3/1996 | Szepesi et al. | |
| 5,546,040 A * | 8/1996 | McCall | H03K 17/12 327/432 |
| 5,642,267 A | 6/1997 | Brkovic et al. | |
| 5,687,068 A | 11/1997 | Jamieson et al. | |
| 5,719,755 A | 2/1998 | Usui | |
| 5,751,171 A | 5/1998 | Ngo | |
| 5,825,640 A | 10/1998 | Quigley et al. | |
| 5,973,945 A | 10/1999 | Balakrishnan et al. | |
| 5,986,484 A | 11/1999 | Kimata | |
| 6,072,702 A | 6/2000 | Nakao et al. | |
| 6,301,135 B1 | 10/2001 | Mammano et al. | |
| 6,456,511 B1 | 9/2002 | Wong | |
| 6,504,267 B1 | 1/2003 | Giannopoulos | |
| 6,563,718 B1 | 5/2003 | Li et al. | |
| 6,738,267 B1 | 5/2004 | Navas Sabater et al. | |
| 7,368,880 B2 | 5/2008 | Lyle, Jr. et al. | |
| 7,450,402 B2 | 11/2008 | Jitaru | |
| 7,835,163 B2 | 11/2010 | Chou | |
| 7,876,583 B2 | 1/2011 | Polivka et al. | |
| 8,000,115 B2 | 8/2011 | Polivka et al. | |
| 8,125,799 B2 | 2/2012 | Zhu et al. | |
| 8,243,477 B2 | 8/2012 | Polivka et al. | |
| 8,823,353 B2 | 9/2014 | Zhang et al. | |
| 8,976,561 B2 | 3/2015 | Balakrishnan et al. | |
| 9,035,435 B2 | 5/2015 | Balakrishnan et al. | |
| 9,083,251 B2 | 7/2015 | Zhang et al. | |
| 9,178,411 B2 | 11/2015 | Djenguerian et al. | |
| 9,246,392 B2 | 1/2016 | Balakrishnan et al. | |
| 9,275,946 B2 | 3/2016 | Balakrishnan et al. | |
| 9,374,019 B2 | 6/2016 | Li et al. | |
| 10,008,942 B1 | 6/2018 | Horwitz et al. | |
| 2005/0254266 A1 | 11/2005 | Jitaru | |
| 2006/0267514 A1 | 11/2006 | Xu | |
| 2007/0024254 A1 | 2/2007 | Radecker et al. | |
| 2008/0181316 A1 | 7/2008 | Crawley et al. | |
| 2008/0267212 A1 | 10/2008 | Crawley et al. | |
| 2008/0278975 A1 | 11/2008 | Degen et al. | |
| 2008/0303560 A1 | 12/2008 | Higashi et al. | |
| 2008/0310191 A1 | 12/2008 | Zhu et al. | |
| 2010/0026268 A1 | 2/2010 | Chang et al. | |
| 2010/0157630 A1 | 6/2010 | Polivka et al. | |
| 2010/0231279 A1 | 9/2010 | Walker et al. | |
| 2011/0018590 A1 | 1/2011 | Tai et al. | |
| 2011/0022867 A1 | 1/2011 | Chang et al. | |
| 2011/0026277 A1 | 2/2011 | Strijker | |
| 2011/0096573 A1 | 4/2011 | Zhu et al. | |
| 2011/0096578 A1 | 4/2011 | Fang et al. | |
| 2012/0153921 A1 | 6/2012 | Brokaw | |
| 2012/0281439 A1 | 11/2012 | Polivka et al. | |
| 2013/0100710 A1 | 4/2013 | Kang et al. | |
| 2013/0299841 A1 | 11/2013 | Ranglack et al. | |
| 2016/0079877 A1 | 3/2016 | Lin et al. | |

OTHER PUBLICATIONS

"LM3001 Primary-Side PWM Driver," National Semiconductor, 1995.

"LM3101 Secondary-Side PWM Controller," National Semiconductor, 1995.

"LTC 3706: Secondary-Side Synchronous Forward Controller with PolyPhase Capability," Linear Technology, 2005, pp. 1-22, as retrieved from: https://www.analog.com/en/products/ltc3706.html#notify.

"LTC3725: Single-Switch Forwarrd Controller and Gate Driver," Linear Technology, 2005, pp. 1-20, as retrieved from: https://www.analog.com/en/products/ltc3725.html#product-documentation.

"MAX630/MAX4193: CMOS Micropower Step-Up Switching Regulator," Maxim, 2008, pp. 1-14, as retrieved from: Ittps://www.maximintegrated.com/en/products/power/MAX4193.html.

"MAX845: Isolated Transformer Driver for PCMCIA Applications," Maxim, Feb. 2017, pp. 01-16, as retrieved from: https://www.maximintegrated.com/en/products/power/isolated-power/MAX845.html.

"MAX1771: 12V or Adjustable, High-Efficiency, Low IQ, Step-Up DC-DC Controller," Maxim Integrated, Feb. 2017, pp. 1-16, as retrieved from: https://www.maximintegrated.com/en/products/power/switching-regulators/MAX1771.html.

"Feedback Isolation Augments Power-Supply Safety and Performance," Maxim Integrated, Jan. 22, 2001, pp. 1-6, as retrieved from: https://www.maximintegrated.com/en/app-notes/index.mvp/id/664.

Power Integrations Design Example Report, "3W Single Output, <10 mW No-load Consumption, Isolated Adapter Using LinkSwitch-XT," Application Engineering Department, DER-227, Oct. 6, 2009, Revision 1.1, pp. 1-28, as retrieved from: https://ac-dc.power.com/sites/default/files/PDFFiles/der227.pdf.

Vu, Tue T. et al. "Primary-side sensing for a flyback converter in both continuous and discontinuous conduction mode," IET Irish Signals and Systems Conference (ISSC 2012), Jun. 2012, pp. 1-6, IET, Maynooth, Ireland.

* cited by examiner

TRIGGER CIRCUITRY FOR FAST, LOW-POWER STATE TRANSITIONS

CROSS-REFERENCE TO RELATED APPLICATIONS

This application is a continuation of U.S. patent application Ser. No. 16/281,384, filed on Feb. 21, 2019, which claims the benefit of the filing date of U.S. provisional application No. 62/635,584, filed on Feb. 27, 2018, and U.S. provisional application No. 62/754,628, filed on Nov. 2, 2018, the teachings of both of which are incorporated herein by reference in their entirety.

BACKGROUND

Field of the Invention

The present invention relates to electronics and, more particularly but not exclusively, to circuits having state transitions, such as current pulse generators used in power converters that perform demand pulse regulation such as described in U.S. Pat. No. 9,071,152 ("the '152 patent"), the teachings of which are incorporated herein by reference in their entirety.

Description of the Related Art

This section introduces aspects that may help facilitate a better understanding of the invention. Accordingly, the statements of this section are to be read in this light and are not to be understood as admissions about what is prior art or what is not prior art.

In a power converter or other galvanically isolated circuit, it is sometimes necessary to send digital information across a galvanic barrier. A dedicated signal transformer may be used as that barrier, or digital signals may be transmitted through a power transformer or other galvanic barrier. In a power converter, it is sometimes desirable for a slowly changing feedback signal to cause a digital event at a particular threshold voltage. Logic gates or comparators may be used to generate such a digital event, but a conventional logic gate or comparator input will draw additional current when the feedback signal lingers near the threshold voltage. That additional current drawn will necessarily reduce efficiency.

SUMMARY

Current pulse generators are described herein that, in response to a slowly changing voltage or current input level, generate a fast edge for digital signaling, for example, through galvanic isolation circuitry. The circuits described can consume relatively little power and can combine the functions of a low-power comparator, a fast-edged pulse generator, and a maximum rate limiter.

A current pulse generator, also referred to herein simply as a pulse generator, is a circuit that generates one or more current pulses. A positive current pulse is characterized by a rapid rise in current (i.e., a fast leading or rising edge) followed soon after by a rapid drop in current (i.e., a fast trailing or falling edge), and vice versa for a negative current pulse. The time between successive current pulses is typically much longer than the duration of each current pulse.

In at least one embodiment, a current pulse generator produces current pulses having extremely fast rising and falling edges in response to a control signal having relatively slow transitions, while consuming relatively little power. Other possible advantages include tolerance of a wide operating voltage range, an extremely wide range of operative output pulse frequencies, and a presettable maximum output pulse frequency.

In at least one embodiment, complimentary pairs of pulse generators form a digital hysteretic buffer producing fast rising and falling edges in response to slowly changing input voltage while consuming relatively little power.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Figure 1:
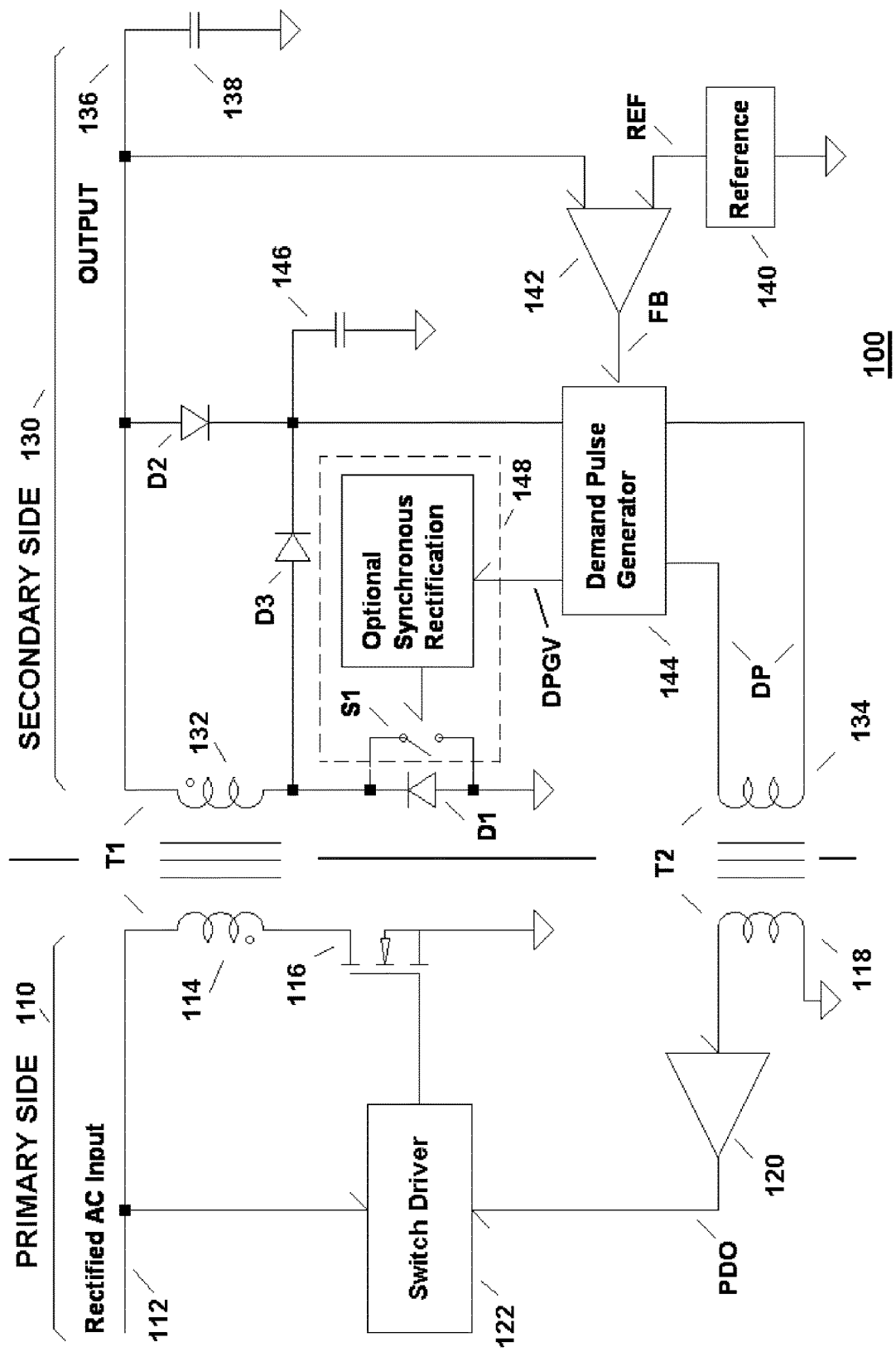
FIG. 1 is a schematic block diagram of an isolated power converter that employs demand pulse regulation (DPR) as described in the '152 patent.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In certain embodiments, a current pulse generator of the present invention functions as a demand pulse generator on the secondary side of an isolated power converter having secondary-side control, such as the power converter 100 of FIG. 1, which is described in further detail below. Current pulse generators of the present invention can be used in power converters for a variety of applications, for example, to convert an AC or DC input signal into a DC output signal to drive an output load. Any slowly changing signal connected to a logic input can cause extra power to be consumed when the slowly changing signal is in between a valid high and a valid low logic level. That extra power will reduce power converter efficiency, particularly at low loads. In one example, the input to the demand pulse generator is the slowly changing output of an error detector, which is representative of the difference between the converter's output voltage or current and a desired reference voltage or current. That error signal may be proportional when produced by an amplifier or digital when produced by a comparator.

In response to the error signal, the demand pulse generator triggers, producing one or more demand pulses that are transmitted from the converter's secondary side to the converter's primary side via the converter's galvanic isolation circuitry, where each demand pulse turns on the converter's primary-side switch to transfer an amount of power from the primary side to the secondary side via the converter's power transformer. Those demand pulses should have a fast leading edge, that is, a fast rise or fall time depending on whether the demand pulse is a positive or negative current pulse, in order to better propagate through the galvanic isolation circuitry. In a low-power circuit, the rate of change of the error signal is expected to be much slower than the edge rate desired for the demand pulses. A desirable demand pulse generator will operate over a wide voltage range and can set a maximum frequency for the generation of demand pulses. A programmable unijunction transistor (PUT) or silicon controlled switch (SCS) could be used as the main active element in the demand pulse generator. As described further below, the demand pulse generator shown in FIG. 2 uses a discrete n-type transistor paired with a discrete p-type transistor to perform a similar function while consuming less power.

Figure 4:
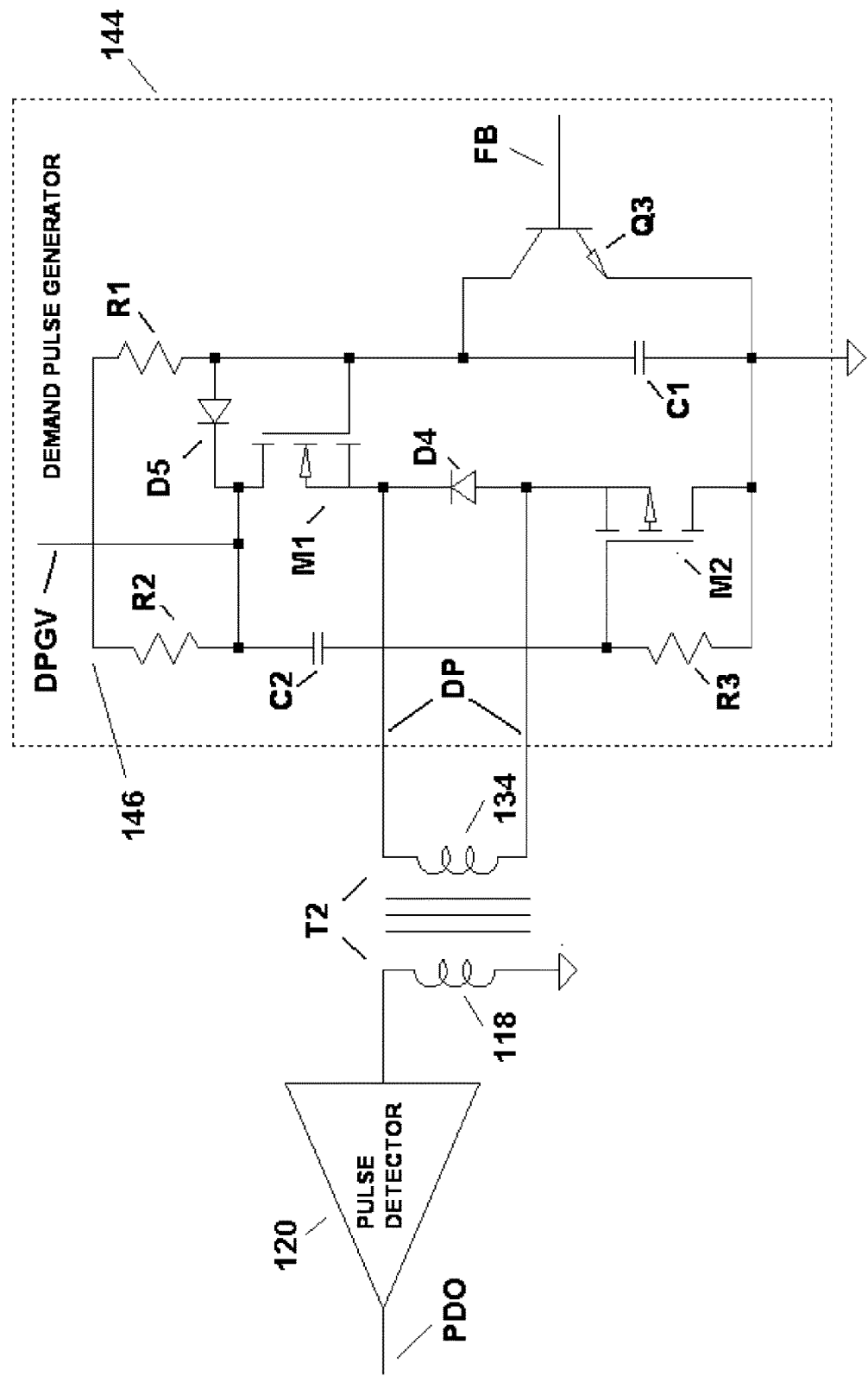
FIG. 4 is a schematic circuit diagram of the demand pulse generator, the signal transformer, and the pulse detector of FIG. 1 showing details for another possible implementation of the demand pulse generator using FET switches.

The demand pulse generator taught in FIG. 4 of the '152 patent employs an oscillator that always runs at the maximum demand pulse frequency even when the demand pulses are generated at a lower rate (by selectively blocking certain oscillator pulses). The demand pulse generators described herein run at the desired demand frequency, thereby saving power at lower demand pulse rates. Furthermore, the demand pulse generators described herein begin to operate at under 3 volts of supply voltage, which simplifies start-up.

FIG. 1 is a schematic block diagram of an isolated power converter 100 that employs demand pulse regulation (DPR) as described in the '152 patent. The power converter 100 has a primary side 110, which receives DC (e.g., rectified AC) input power at the input node 112, and a secondary side 130, which generates output power at the output node 136. The primary and secondary sides are galvanically isolated by two galvanic barriers: a power transformer T1 and a signal transformer T2. The secondary side 130 is designed to generate demand pulses DP that are conveyed to the primary side 110 via the signal transformer T2 to instruct the primary side to transfer power to the secondary side via the power transformer T1 as needed to satisfy the demand at the output node 136.

The primary side 110 of the power converter comprises a switch driver 122 powered from the input node IE, a main switch 116 (e.g., a FET or bipolar transistor), a pulse detector 120, and two transformer windings: the primary winding 114 of the power transformer T1 and the secondary winding 118 of the signal transformer T2. Note that the secondary winding 118 of the signal transformer T2 is on the primary side 110 of the converter, while the primary winding 134 of the signal transformer T2 is on the secondary side 130 of the converter. The primary side 110 is designed such that the switch driver 122 turns on the main switch 116 whenever the pulse detector 120 detects a demand pulse DP on the secondary winding 118 of the signal transformer T2, as indicated by the signal PDO. Turning on the main switch 116 enables the input current from the input node 112 to flow through the primary winding 114 of the power transformer T1, thereby energizing the primary winding 114 of the power transformer T1. The switch driver 122 determines when to turn off the main switch 116, based on voltage, current, or time, or a combination thereof, similar to the functionality described in the '152 patent. When the main switch 116 turns off, power is transferred to the secondary side 130 of the converter via the power transformer T1.

The secondary side 130 of the power converter comprises the secondary winding 132 of the power transformer T1, the primary winding 134 of the signal transformer T2, the output node 136, filtered by filter capacitor 138, a reference generator 140 generating reference voltage REF, an error amplifier 142 producing a feedback signal FB, a demand pulse generator 144, a rectifier (i.e., diode D1), a capacitor 146 functioning as a local power supply, optional synchronous rectification circuitry 148, and optional switch S1. If the synchronous rectification circuitry 148 is present, then the diode rectifier D1 may be intrinsic to the switch S1.

The error amplifier 142 generates an analog feedback signal FB responsive to the difference between the reference voltage REF and the output voltage 136 and applies that feedback signal FB to the demand pulse generator 144. When the output voltage 136 is relatively low, the feedback signal FB will be low and the demand pulse generator 144 will operate at or near its maximum frequency. When the output voltage 136 is relatively high, the feedback signal FB will be high and the demand pulse generator 144 will not operate. When the output voltage 136 is at an intermediate voltage, the demand pulse generator 144 can generate demand pulses at an intermediate rate.

In the embodiment of FIG. 1, the demand pulse generator 144 receives its operating power from the capacitor 146, which is charged either during forward strokes of the power converter via the diode D3 or during flyback (i.e., reverse)

strokes of the power converter via diode D2. Powering capacitor 146 during forward strokes insures reliable start-up, even in the presence of a short-circuited output. Under normal operating conditions, the capacitor 146 is charged only during forward strokes. If and when the output load goes to zero and the capacitor voltage falls at least a diode drop below the output voltage 136, the capacitor 146 will also be charged by flyback strokes.

The demand pulse generator 144 produces demand pulses DP that, by way of the signal transformer T2, the pulse detector 120, and the switch driver 122, cause the main switch 116 to turn on for a limited time for each demand pulse DP so as to transfer power from the primary side 110 to the secondary side 130 via the power transformer T1.

When present, the synchronous rectification circuitry 148 receives, from the demand pulse generator 144, a voltage timing signal DPGV that indicates when the demand pulse generator 144 is generating another demand pulse DP. In response, the synchronous rectification circuitry 148 opens switch S1 to avoid current flowing the wrong way through switch S1 when the main switch 116 is closed. When the main switch 116 is opened, the synchronous rectification circuitry 148 closes switch S1, thereby eliminating the diode drop across the diode D1 and reducing the associated power losses.

In alternative implementations of the power converter 100, the output voltage 136 can be resistively divided before being applied to the error amplifier 142, with the reference voltage REF similarly reduced to a lower voltage level.

Figure 2:
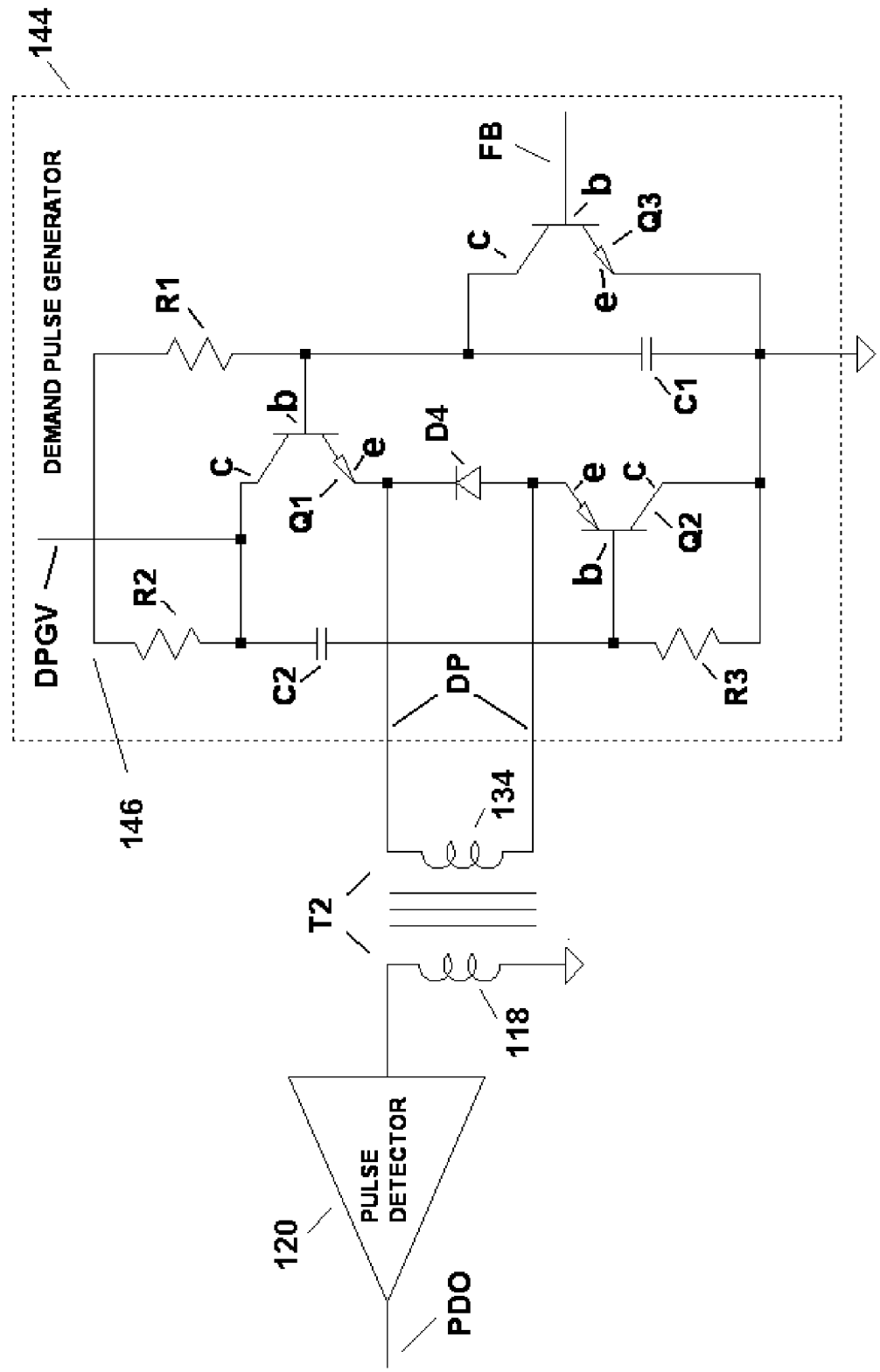
FIG. 2 is a schematic circuit diagram of the demand pulse generator, the signal transformer, and the pulse detector of FIG. 1 showing details for one possible implementation of the demand pulse generator.

FIG. 2 is a schematic circuit diagram of the demand pulse generator 144, the signal transformer T2, and the pulse detector 120 of FIG. 1 showing details for one possible implementation of the demand pulse generator 144. As shown in FIG. 2, the feedback signal FB from the error amplifier 142 of FIG. 1 is applied to the base of n-type (npn bipolar) transistor Q3. When the feedback signal FB is low, transistor Q3 is off, which allows the local power supply V+ (i.e., capacitor 146 of FIG. 1) to charge the timing capacitor C1 via the timing resistor R1 until transistor Q1 begins to turn on, which pulls down on the junction DPGV between resistor R2 and capacitor C2, which pushes down the voltage at the base of transistor Q2 through the action of capacitor C2, thereby turning on transistor Q2. If either transistor Q1 or Q2 begins to turn on, both transistors are turned on abruptly because current through transistor Q2 increases the base-to-emitter junction voltage of Q1, and vice versa. The abrupt turning on of both transistors lasts only until the voltage between the collector of Q1 and the collector of Q2 falls to near zero volts, at which time there is insufficient voltage present to keep either transistor on. Both transistors remain off until there is enough voltage between the base of transistor Q1 and the base of transistor Q2 to restart the process. With transistors Q1 and Q2 on, the capacitive energy in capacitor C1 is rapidly drained by the current through transistors Q1 and Q2 as DPGV drops abruptly to near zero volts. Note that, although a small amount of current continues to flow through resistor R1 from the local power supply V+, the low impedance path through transistors Q1 and Q2 and the transformer winding 134 violently discharges the capacitor C1, overwhelming the charging from resistor R1. The resulting abrupt current passes through the primary winding 134 of the signal transformer T2, producing a demand pulse DP. Catch diode D4 will then conduct, absorbing the voltage spike caused by the inductance of the primary winding 134 of transformer T2. Catch diode D4 can be placed on either side of transformer T2, or the inductive recovery current can be limited with a snubber, as is known in the art.

Once capacitor C1 is drained and DPGV is near zero volts, there is not sufficient voltage present to keep either transistor Q1 or Q2 in the on state, so capacitor C1 begins to charge again through resistor R1, and the voltage at DPGV rises due to the pull-up action of resistor R2. The rising DPGV voltage at capacitor C2 causes the base of transistor Q2 to rise, insuring that it remains off. Capacitor C2 provides positive feedback for faster switching during both the positive and the negative transitions. As used herein, the term "positive feedback" refers to feedback that speeds transitions within circuitry, such as the turning on or off of transistors within the circuitry, as well as feedback that speeds transitions in the output signals generated by that circuitry, such as the pulses generated by a pulse generator, thereby shortening the rise and/or fall times of those pulses.

As long as the feedback signal FB is sufficiently low such that the npn transistor Q3 does not prevent charging of capacitor C1, the demand pulse generator 144 will continue to oscillate and generate demand pulses DP, each of which causes the main switch 116 of FIG. 1 to turn on, thereby transferring more power from the primary side 110 to the secondary side 130 via the power transformer T1 and causing the output voltage 136 to rise. As the output voltage 136 rises towards the reference voltage REF, the feedback signal FB also rises, which starts to turn on the n-type transistor Q3, which in turn draws current and slows down the charging of the timing capacitor C1, thereby slowing down the frequency of oscillation of the demand pulse generator 144 and therefore the frequency of generation of the demand pulses DP. If and when the feedback signal FB is high enough to turn on transistor Q3 sufficiently to stop charging of capacitor C1 (e.g., when the output voltage 136 reaches or exceeds the reference voltage REF), capacitor C1 never sufficiently charges, n-type transistor Q1 never turns on, and demand pulses DP are not generated.

Figure 3:
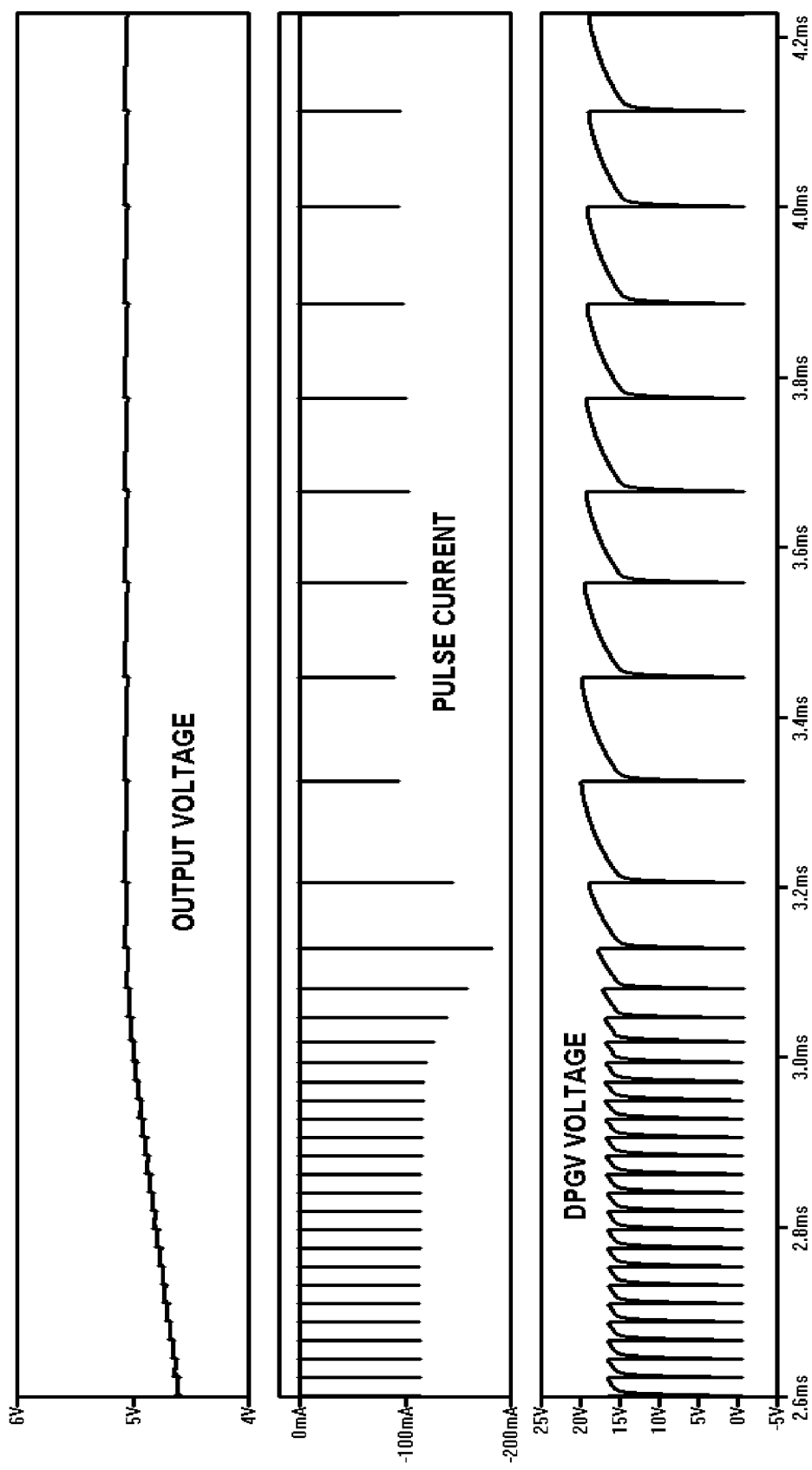
FIG. 3 shows simulated SPICE waveforms for the power converter of FIGS. 1 and 2.

As shown in FIG. 3, which is described further below, the negative edges of the timing signal DPGV are synchronized with the demand pulses. The timing signal DPGV is helpful, though not essential, as an input to the optional synchronous rectification circuitry 148 of FIG. 1, because DPGV provides an indication just before the turning on of the main switch 116. Instead of explicitly sensing that the main switch 116 has been turned on, the DPGV signal allows the synchronous rectification circuitry 148 to insure that switch S1 of FIG. 1 is off a few nanoseconds in advance of the main switch 116 turning on. The efficiency of the synchronous rectifier would be ruined if switch S1 and the main switch 116 were on at the same time, even for a few nanoseconds, because current in switch S1 would then flow in the wrong direction.

To reduce power consumption, the energy that is accumulated in the timing capacitor C1 is also used to energize the signal transformer T2 when generating a demand pulse DP. Resistor R1 admits a tiny current from the local power supply V+ to charge timing capacitor C1 which ramps up in voltage. Transistors Q1 and Q2 are in series with the primary winding 134 of the signal transformer T2. The demand pulse generator 144 includes positive feedback for fast action both when turning on and when turning off the pulse current. When timing capacitor C1 charges to two turn-on threshold voltages above the voltage at the base of Q2, both transistors Q1 and Q2 turn on abruptly. As used herein, the term "turn-on threshold voltage" refers to a voltage at which the transistor turns on. For bipolar transistors, the turn-on threshold voltage is the base-to-emitter voltage at which the transistor begins to turn on. For field-effect transistors, the turn-on threshold voltage is the gate-to-source voltage at which the transistor begins to turn on.

Capacitor C2 provides positive feedback to insure both transistors are fully on. The sudden current continues until node DPGV is near ground potential, at which time the two transistors Q1 and Q2 have no voltage across them and can draw no current. There is then insufficient voltage present to reach the turn-on threshold voltages, so the two transistors Q1 and Q2 turn off, resistor R2 begins to pull node DPGV back up toward the local power supply voltage V+. Positive-feedback capacitor C2 now couples that upward shift to the base of transistor Q2, insuring that no current will flow in transistors Q1 and Q2, thereby allowing timing capacitor C1 to resume charging. The process then repeats.

If transistor Q3 is turned on by a rising feedback signal FB, which indicates near or total sufficiency at the output node 136, then the timing capacitor C1 will charge more slowly, or not at all, thereby retarding or stopping the generation of demand pulses DP.

The maximum pulse rate is determined by the time constant set by the ratio of the timing resistor R1 to the timing capacitor C1. The capacitance values of capacitors C1 and C2 are the main determinants of the magnitude of the pulse current of the demand pulses DP. The comparator function provided by transistor Q3 requires a very low base current and tolerates very slow rise and fall times. At low pulse rates corresponding to low loads, the demand pulse generator 144 can operate while consuming under 100 microwatts. In general, power consumption for the demand pulse generator 144 of FIGS. 1 and 2 can be less than 10% of the power consumption for equivalent PUT-based or SCS-based demand pulse generators.

The local power supply voltage V+ can be as low as a few volts or as high as the voltage ratings of the transistors. That flexibility can eliminate the need for a regulated supply to power the secondary side 130 of the power converter 100 of FIG. 1. Also, since the demand pulse generator 144 can be designed to run at a local power supply voltage of under 5 volts, the demand pulse generator 144 can be powered through a diode connected to a regulated 5-volt output. In that case, the local power supply would be needed only for startup, allowing the local power supply to be completely shut down during normal operation for additional power savings. To implement that feature, a switch could be connected in series with diode D3 in FIG. 1, where the switch would be closed if the output voltage 136 were too low and otherwise the switch would be open.

In the power converter 100 of FIGS. 1 and 2, the load for the demand pulse generator 144 is the inductive primary winding 134 of the signal transformer T2. As described in further detail below, the circuitry used to implement the demand pulse generator 144 in the isolated power converter 100 of FIGS. 1 and 2 can be used to implement a current pulse generator for other applications. If an application does not involve isolation, then the pulse generator load can be, but does not need to be inductive. The load can be resistive, or the load can be a diode or any other suitable current-driven device.

Because large pulse currents are available at low power levels, the signal transformer T2 need not have much inductance or very good coupling between the primary and secondary windings 134 and 118. Transformer winding inductance can be under 10 nH, and the coupling factor K of the signal transformer T2 can be as low as 0.5. That flexibility allows size and cost savings for the galvanic isolation.

FIG. 3 shows simulated SPICE waveforms for the power converter 100 of FIGS. 1 and 2. In the top trace, the output voltage 136 is seen rising to the regulation point, here 5 Volts. The demand pulses DP are seen in the middle trace, where each demand pulse is represented as a brief negative current pulse. From time 2.6 ms until about time 3.0 ms, the demand pulses DP are generated at the maximum allowed rate as the output voltage 136 rises. As the output voltage 136 nears the regulation point, the rate of demand pulses DP slows from time 3.0 ms to time 3.2 ms. At the regulation point, after time 3.2 ms, the demand pulses DP occur at a constant rate so as to support a constant load.

The bottom trace shows the voltage at the junction of resistor R2 and capacitor C2 of FIG. 2 at node DPGV. When the demand pulse generator 144 triggers (i.e., generates a single demand pulse DP), the DPGV voltage drops quickly to near zero volts. Between triggers, the DPVG voltage rises toward the local power supply voltage V+ because of the current in pull-up resistor R2. The local power supply is unregulated in this example, so the local power supply voltage V+ also rises when the regulation point is reached because the demand pulse generator 144 loads the local power supply more lightly. Note that the local power supply voltage V+ is substantially equivalent to the DPGV waveform shown in FIG. 3, but without the downward spikes.

FIG. 4 is a schematic circuit diagram of the demand pulse generator 144, the signal transformer T2, and the pulse detector 120 of FIG. 1 showing details for another possible implementation of the demand pulse generator 144. The circuit of FIG. 4 is identical to the circuit of FIG. 2 with three exceptions: npn transistor Q1 has been replaced by nmos FET M1, pnp transistor Q2 has been replaced with pmos FET M2, and diode D5 has been added. The FETs M1 and M2 perform the functions of the bipolar transistors Q1 and Q2, and the circuit operates in the same fashion as the circuit of FIG. 2. Diode D5 provides a path for discharging timing capacitor C1 (along with transistors M1 and M2 and primary winding 134) when the demand pulse generator 144 triggers. Note that any combination of FETs and bipolar transistors can be used to make a circuit with equivalent function to the circuit of FIG. 2.

The catch diode D4 of FIGS. 2 and 4 catches the recovery current that restores the inductive transformer winding 134. If that current is not caught on the secondary side 130 of the power converter 100, then a recovery pulse will show up on the primary-side transformer winding 118 in the opposite polarity from the demand pulse. Adding an additional switch in series with the catch diode D4 across the primary winding of T2 in the demand pulse generator 144 provides a means for auxiliary digital signaling, which would not alter the basic function of the demand pulse generator 144.

Figure 5A:
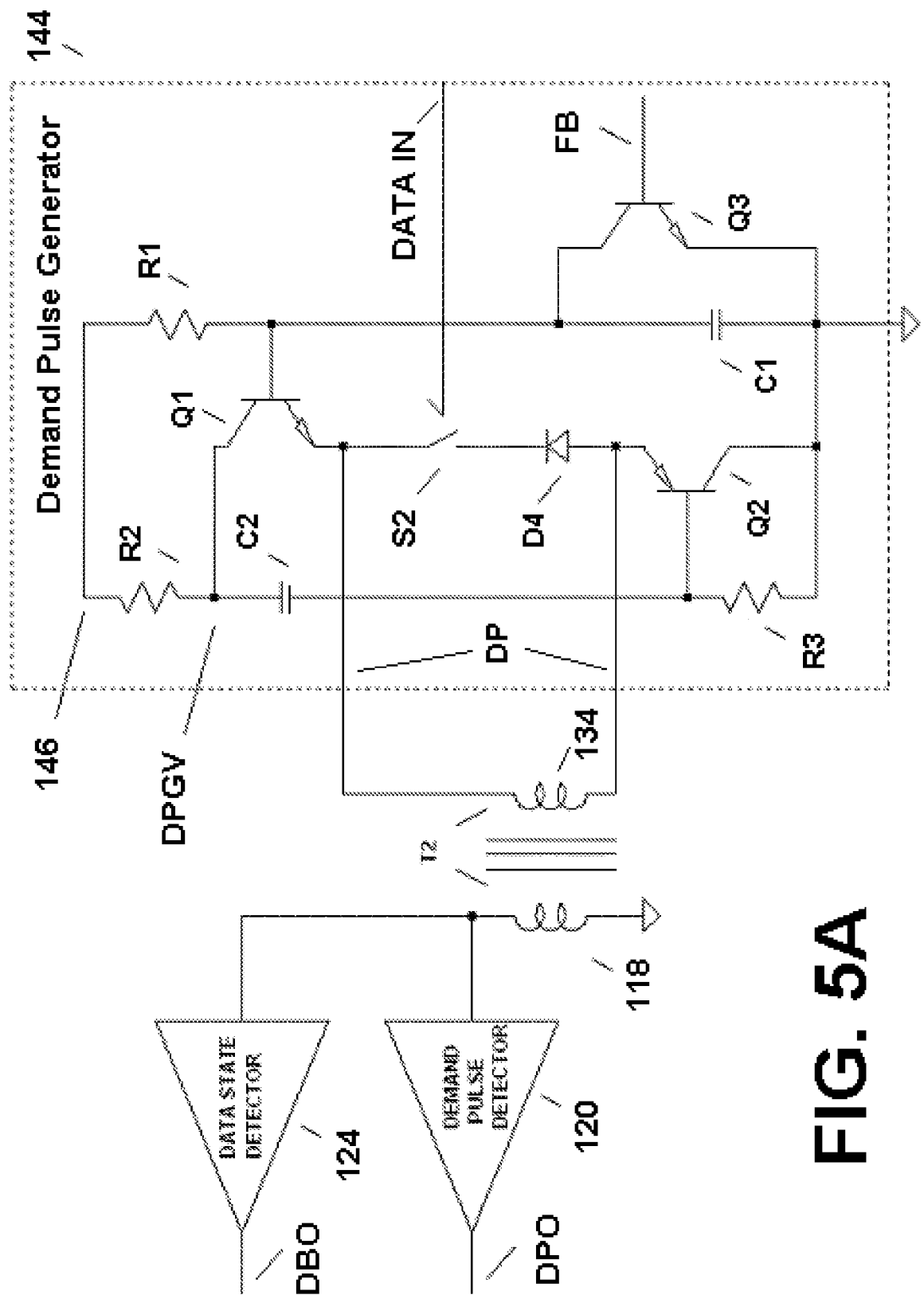
FIG. 5A is a schematic circuit diagram of the demand pulse generator, the signal transformer, and the pulse detector of FIG. 1 showing details for adding single-bit auxiliary digital signaling.

FIG. 5A is a schematic circuit diagram of the demand pulse generator 144, the signal transformer T2, and the pulse detector 120 of FIG. 1 showing details for yet another possible implementation of the demand pulse generator 144. The circuit of FIG. 5A is identical to the circuit of FIG. 2 with the following exceptions: (i) the addition of switch S2 in series with diode D4 and (ii) the addition of data state detector 124 on the primary side of the signal transformer T2 which catches the recovery current. These additional elements provide a one-bit communication channel having a data rate equal to the pulse rate. Any sort of user-defined digital information could be transmitted from the secondary side to the primary side by modulating the switch S2 using the data signal DATA IN. If switch S2 is opened, then recovery current will flow on the primary side at the trailing edge of a demand pulse DP. That recovery current can be detected by the data state detector 124. If switch S2 is closed, then recovery current will flow in D4 on the secondary side, and no recovery current will be detected by data state detector 124.

Such auxiliary digital signaling could be used to send information from the secondary side 130 of the power converter 100 of FIG. 1 to the switch driver 122 so as to modify its behavior. In various implementations, this additional information could be used, for example, as an over-temperature warning or to select between USB-PD and Quick Charge™ optimization.

Figure 5B:
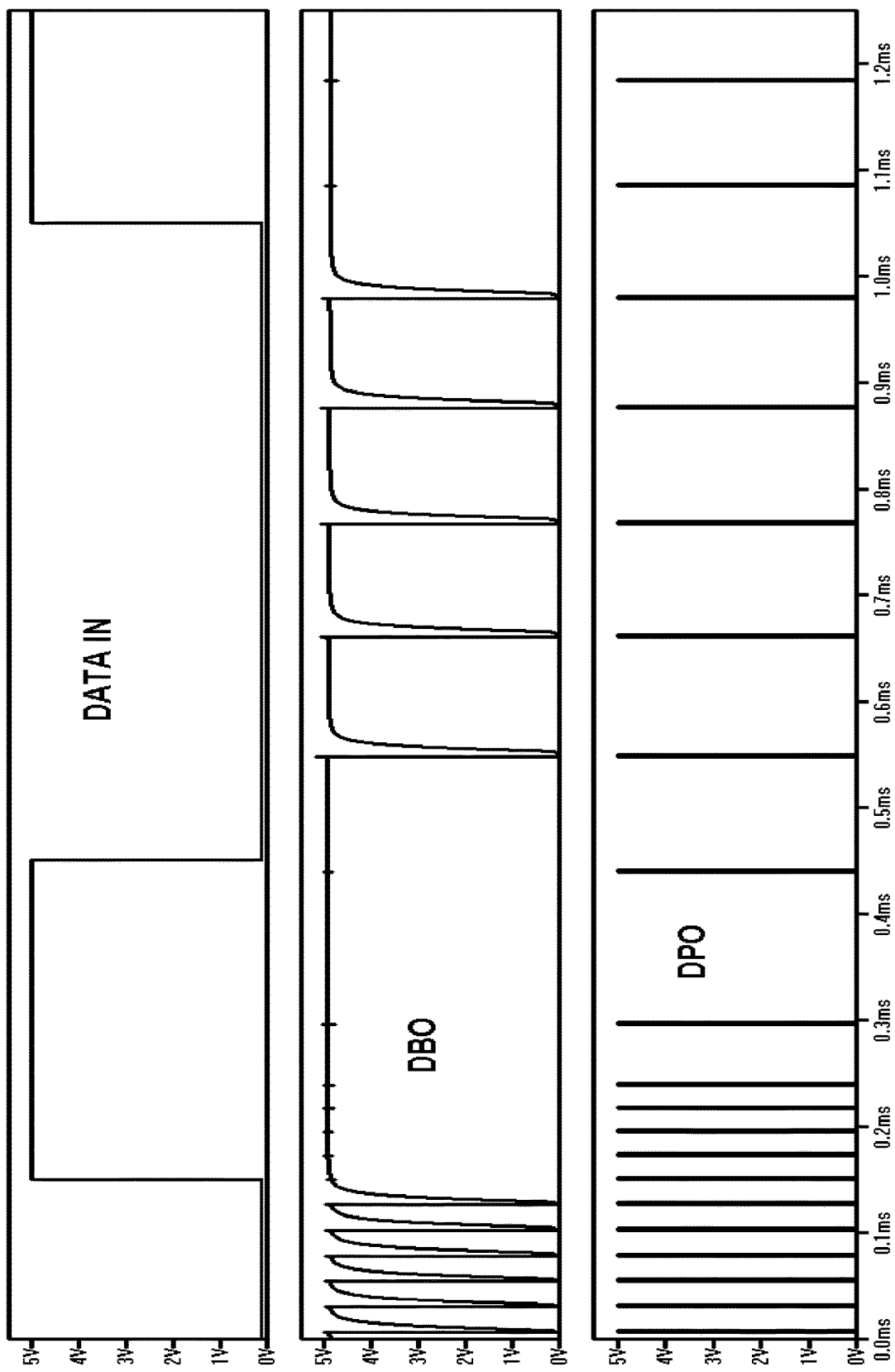
FIG. 5B shows simulated waveforms for the single-bit auxiliary digital signaling circuitry of FIG. 5A in operation.

FIG. 5B shows simulated waveforms for the modified demand pulse generator 144 of FIG. 5A. The top trace DATA IN is an arbitrary series of digital ones and zeros. The middle trace DBO is the output of the data state detector 124 on the primary side. The lower trace DPO is the output of the demand pulse detector 120 on the primary side. It can be seen that, whenever the digital DATA IN is low (and switch S2 is open), the demand pulses are accompanied by DBO pulses. Whenever the digital DATA IN is high (and switch S2 is closed), there are no DBO pulses. Thus, if a DPO demand pulse is detected on the primary side that is not accompanied by a DBO pulse, then the state of DATA IN is known to be high on the primary side. On the other hand, if a DPO demand pulse is accompanied by a DBP pulse, then the state of DATA IN is known to be low on the primary side.

Although the invention has been described so far in the context of current pulse generators for generating demand pulses for power converters that employ demand pulse regulation, the invention is not so limited. In general, the invention can be implemented to provide current pulse generators for other suitable applications. Those applications include any comparator function requiring a fast output edge in response to a slow input with low power consumption. IoT devices and battery-powered electronics such as implantable medical devices are good candidates.

Figure 6A:
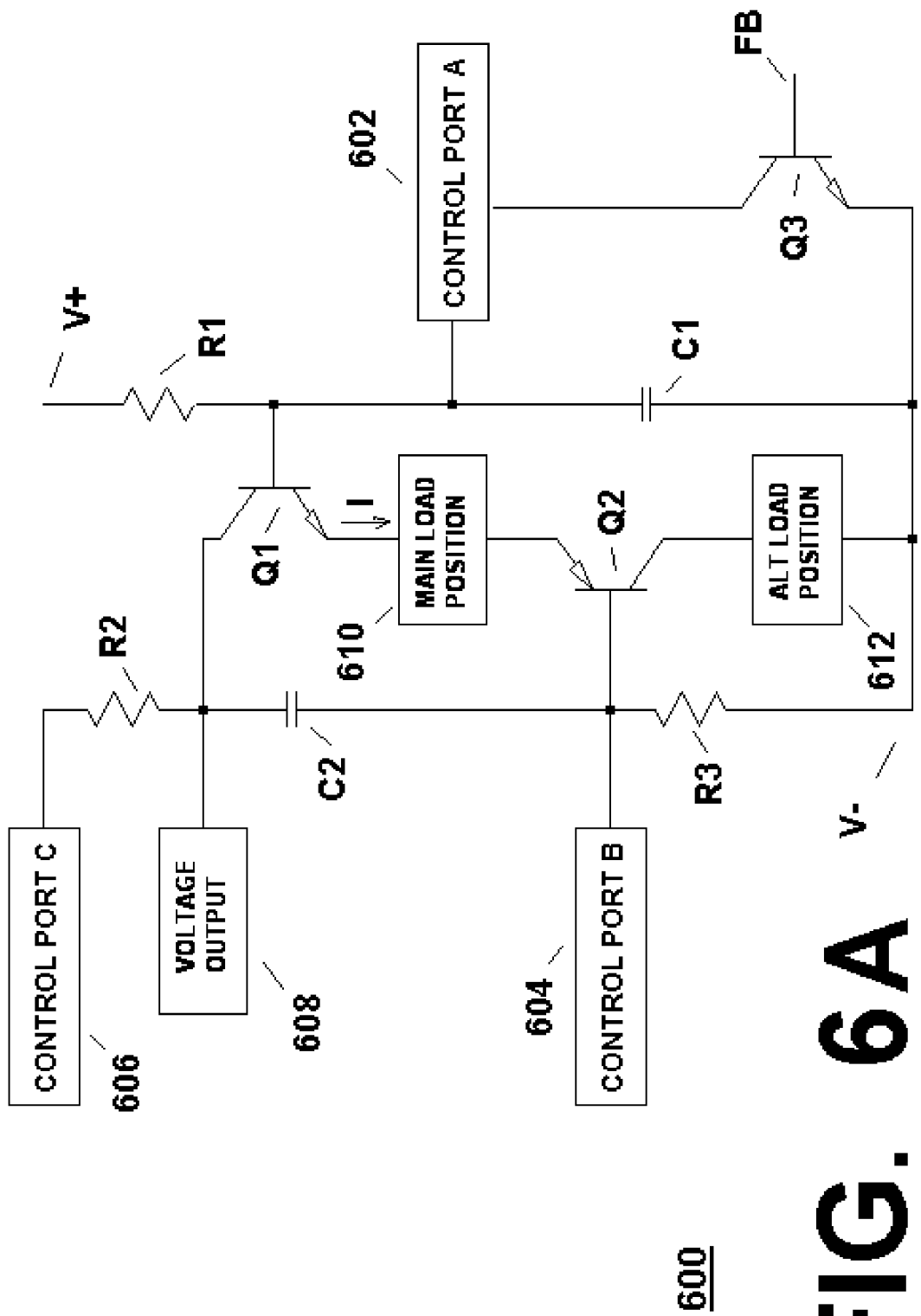
FIG. 6A is a generalized schematic circuit diagram of a pulse generator according to certain embodiments of the invention.

FIG. 6A is a generalized schematic circuit diagram of a circuit 600 according to certain embodiments of the invention. Depending on how the circuit 600 is controlled, it can operate as a current pulse generator analogous to the demand pulse generators of FIGS. 2 and 4-5 (although the circuit 600 can be used as a current pulse generator in applications other than an isolated power converter), as a form of one shot, or as a time-delay circuit. Using the triggering approach of FIG. 6A, analog time-delay circuits can exhibit the crisp and repeatable performance previously seen only with digital time-delay circuitry. The circuit 600 has the same basic elements (i.e., n-type transistor Q1, p-type transistor Q2, timing resistor R1, timing capacitor C1, positive-feedback capacitor C2, and resistors R2-R3) as the demand pulse generator 144 of FIG. 2. In addition to the control port A, of which the collector of n-type transistor Q3 of FIG. 2 is an example, the circuit 600 has additional or alternative control ports B and C that can be used to control the operations of the circuit 600.

FIG. 6A be modified and adapted in a variety of ways. Current can be injected or removed from almost any node in the circuit to influence the frequency of oscillation or the magnitude of the pulse current, or to stop oscillation entirely. The symmetry of the circuit allows either capacitor C1 or C2 to act as the timing capacitor, and either or both can act as positive-feedback capacitors. The particular values selected for the resistors and capacitors will determine the range of frequencies and currents available and the start-up behavior, which can be a critical factor in the practicality of oscillating circuits. An oscillator should start predictably to be reliable, and should not draw excessive current during start up. The circuit of FIG. 6A provides a basis for providing all of these advantages.

Figure 6B:
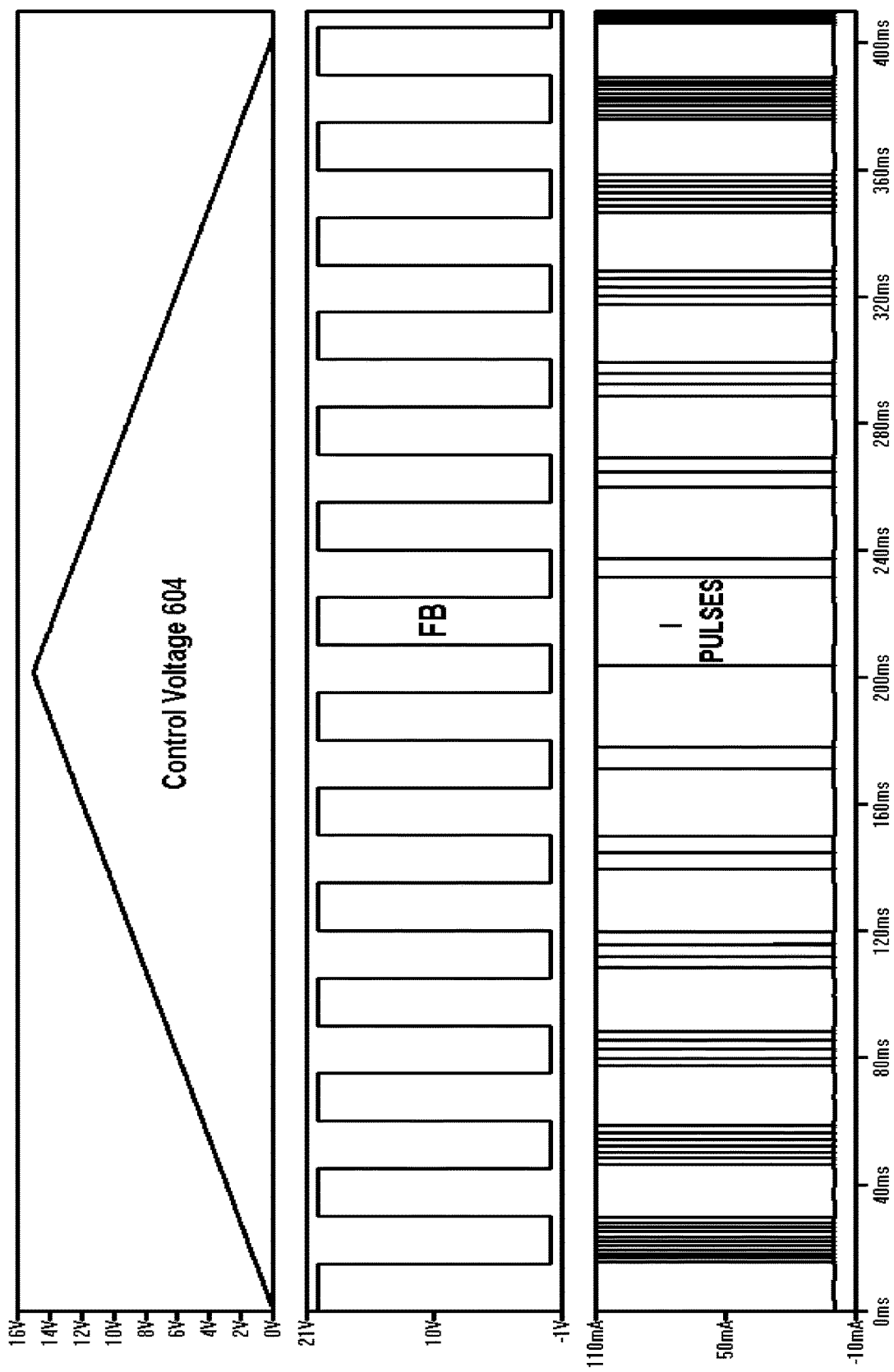
FIG. 6B shows simulated SPICE waveforms for the circuit of FIG. 6A operating as a gated, voltage-controlled oscillator.

FIG. 6B shows simulated waveforms for the circuit 600 of FIG. 6A operating as a gated, voltage-controlled oscillator. The control voltage 604 is applied at control port B. The feedback voltage FB is used to gate the oscillator. When FB is low, transistor Q3 is off, which allows the circuit 600 to oscillate and generate current pulses I through the main load position 610 or the alternative load position 612. When FB is high, transistor Q3 is on, thereby holding the voltage 602 at capacitor C1 low, so that oscillation stops. The frequency of oscillation is modulated by the voltage 604 at control port B. The voltage 602 at control port A needs to rise to two turn-on threshold voltages above the voltage at the control port B in order to trigger the pulse output I. Since control port A is reset to near zero volts each time the circuit 600 triggers, the control voltage 602 has further to rise in order to reach the trigger point as control voltage 604 goes up. The extra time required for the additional charging at control port A increases the period and decreases the frequency of oscillation. When the control voltage 604 is near its maximum, only one current pulse I occurs during the enable time provided by the gating signal FB. If control voltage 604 were to rise above two threshold drops below the local power supply voltage 6Q, the oscillation would stop, regardless of the state of FB.

This type of voltage-controlled oscillator provides several advantages over conventional circuits. The oscillating circuit 600 runs over a wide power supply voltage range, and starts reliably and predictably. Power consumption can be micro watts, and the fast edge at triggering provides precise timing.

Figure 6C:
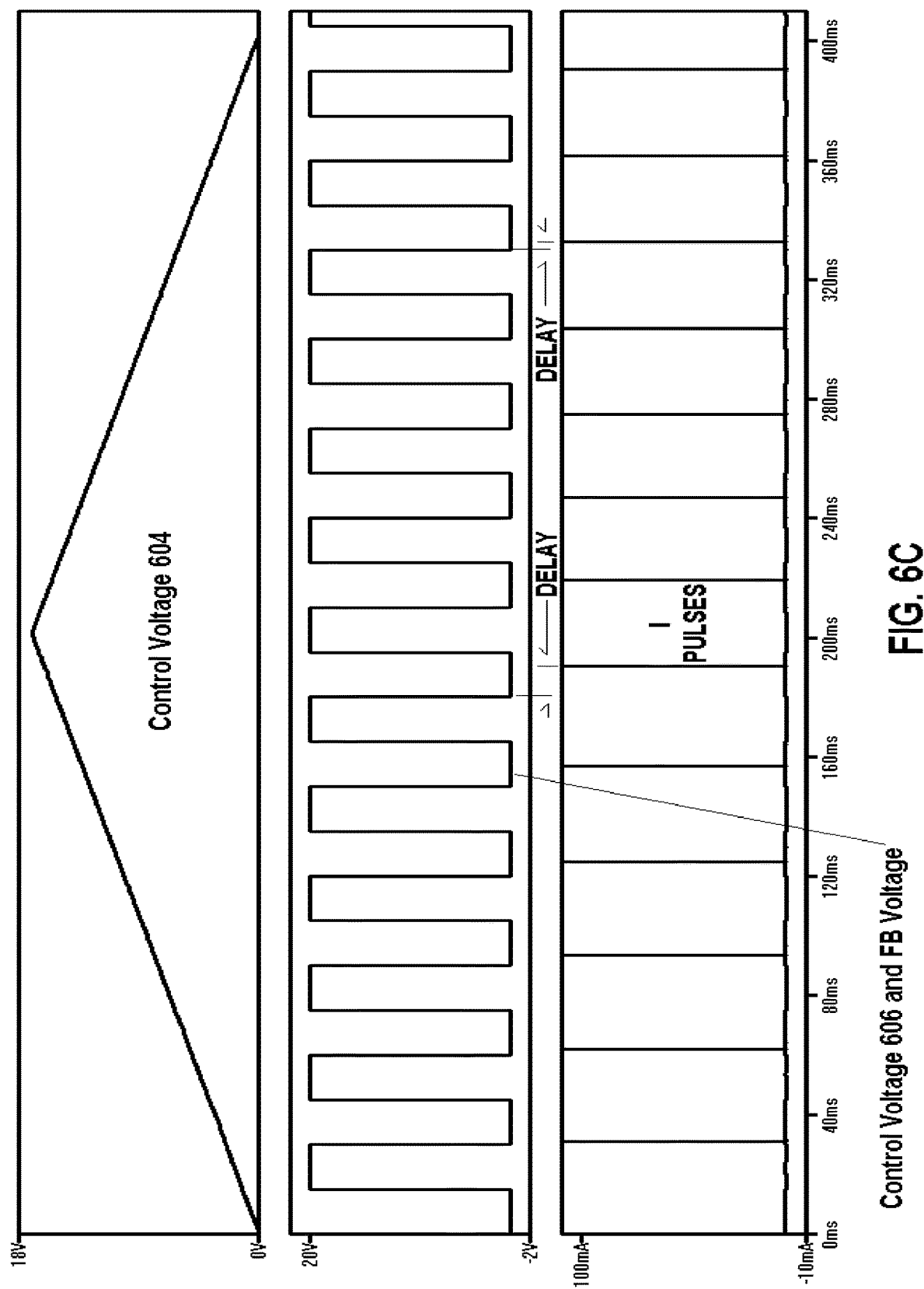
FIG. 6C shows simulated SPICE waveforms for the circuit of FIG. 6A operating as a variable delay generator.

FIG. 6C shows simulated SPICE waveforms for the circuit 600 of FIG. 6A operating as a variable delay generator. The control voltage 604 at control port B ramps up and down in similar fashion to FIG. 6B. The signal FB is applied to the base of transistor Q3 through a resistor to enable the signal FB to rise to the local power supply voltage V+. Control voltage 606 applied at control port C through a diode is identical to the FB voltage and arms the circuit 600 for triggering. When FB and control voltage 606 are high, the trigger is armed but the timing capacitor C1 cannot charge because transistor Q3 is held on by FB. When FB falls, C1 begins to charge. When the voltage 602 at control node A reaches a voltage two threshold drops above the voltage 604 at control node B the circuit 600 triggers, producing a current pulse I and a fast voltage edge at the output port 608, where the delay between the falling edge of FB and the current pulse I is directly related to the magnitude of the control voltage 604 at control port B. The output port 608 will stay low, and no more pulses will be generated until the circuit 600 is re-armed by control voltage 606 rising again. As in FIG. 6B, the delay time is set by the voltage 604 at control port B over a range that is determined by resistor and capacitor values.

If a switchable current source is used in place of resistor R1 and transistor Q3 to control the charging of capacitor C1, then the armed but untriggered current can approach zero. The unarmed current can also approach zero. With almost no input power, the trigger of FIG. 6C generates very fast output pulses even with a slowly changing signal 602 at control port A. A circuit producing a digital output signal with a relatively fast edge in response to a slowly changing analog or digital input signal can be characterized as an edge accelerator. The edge accelerator taught here has the advantage of very low input power.

In addition to the main load position 610, of which the primary winding 134 of FIG. 2 is an example, the circuit 600 has an alternative load position 612 below both transistors Q1 and Q2 at which output current pulses can appear. Under some circumstances, it may be convenient to have a ground-referenced load at the alternative load position 612. Moving the load to the alternative load position 612 does not change the fundamental circuit behavior. At either load position 610 or 612, the nature of the load does not need to be inductive for the operation of the circuit 600. It would also be possible to place a load in series with the collector of transformer Q1. Possible loads include, but are not limited to, laser or light-emitting diodes, gate drivers for solid-state switches, triac or SCR (silicon controlled rectifier) triggering circuits, strobe lights, or sound-generating transducers. The output pulse at the load position 610 or 612 could also be applied directly to the primary winding of a power transformer.

Different types of control signals can be applied to the control ports A and B singly or in combination to modify the behavior of the circuit 600 in different ways. Control possibilities include changing the maximum operating frequency, slowing, speeding, or stopping pulse generation, varying the magnitude of the pulsed current, and, within certain narrow limits, varying the pulse width.

For example, if no current is applied to the control port A, then (i) the timing capacitor C1 will charge at a free-running time constant based on the timing capacitor C1 and the timing resistor R1 and (ii) the circuit 600 will generate current pulses flowing through the main load position 610 and the alternative load position 612 at a free-running frequency of the circuit 600.

If, instead, a moderate sink current is applied to the control port A, then (i) the timing capacitor C1 will charge at a time constant longer than the free-running time constant and (ii) the circuit 600 will generate current pulses at a frequency lower than the free-running frequency. If a sufficiently high sink current is applied to the control port A, then (i) the timing capacitor C1 will not charge to a threshold level sufficient to turn on transistor Q1 and (ii) the circuit 600 will stop generating current pulses. Note that the n-type transistor Q3 of FIG. 2 is capable of controlling the frequency of current pulses from zero (when Q3 is more strongly on) to the free-running frequency (when Q3 is off).

If, instead of a sink current, a source current is applied to the control port A, then (i) the timing capacitor C1 will charge at a time constant shorter than the free-running time constant and (ii) the circuit 600 will generate current pulses at a frequency higher than the free-running frequency. This function can be achieved by connecting and appropriately controlling a (p-type or n-type) transistor between the control port A and the power supply V+ either instead of or in addition to the transistor Q3. With a current source applied to capacitor C1, resistor R1 can be omitted, so that the charging of C1 is entirely determined by the current source.

As described previously with respect to the pulse generator of FIG. 6A, an appropriate positive voltage signal can be applied at the control port B of FIG. 6A to prevent transistor Q2 from turning on in order to prevent the circuit 600 from generated current pulses. In general, influencing the voltage at control port B changes the trigger threshold for control port A. Raising or lowering that trigger threshold can alter the frequency with which the circuit 600 generates current pulses, including completely stopping the generation of current pulses. When the circuit 600 is operated as a one shot, the DC triggering level is established at control port B.

By using power transistors for the switching elements Q1 and Q2 in FIG. 6A, arbitrarily large amounts of power can be pulsed efficiently for applications that require periodic, high-power current pulses, such as range finders and medical imaging systems.

Figure 7:
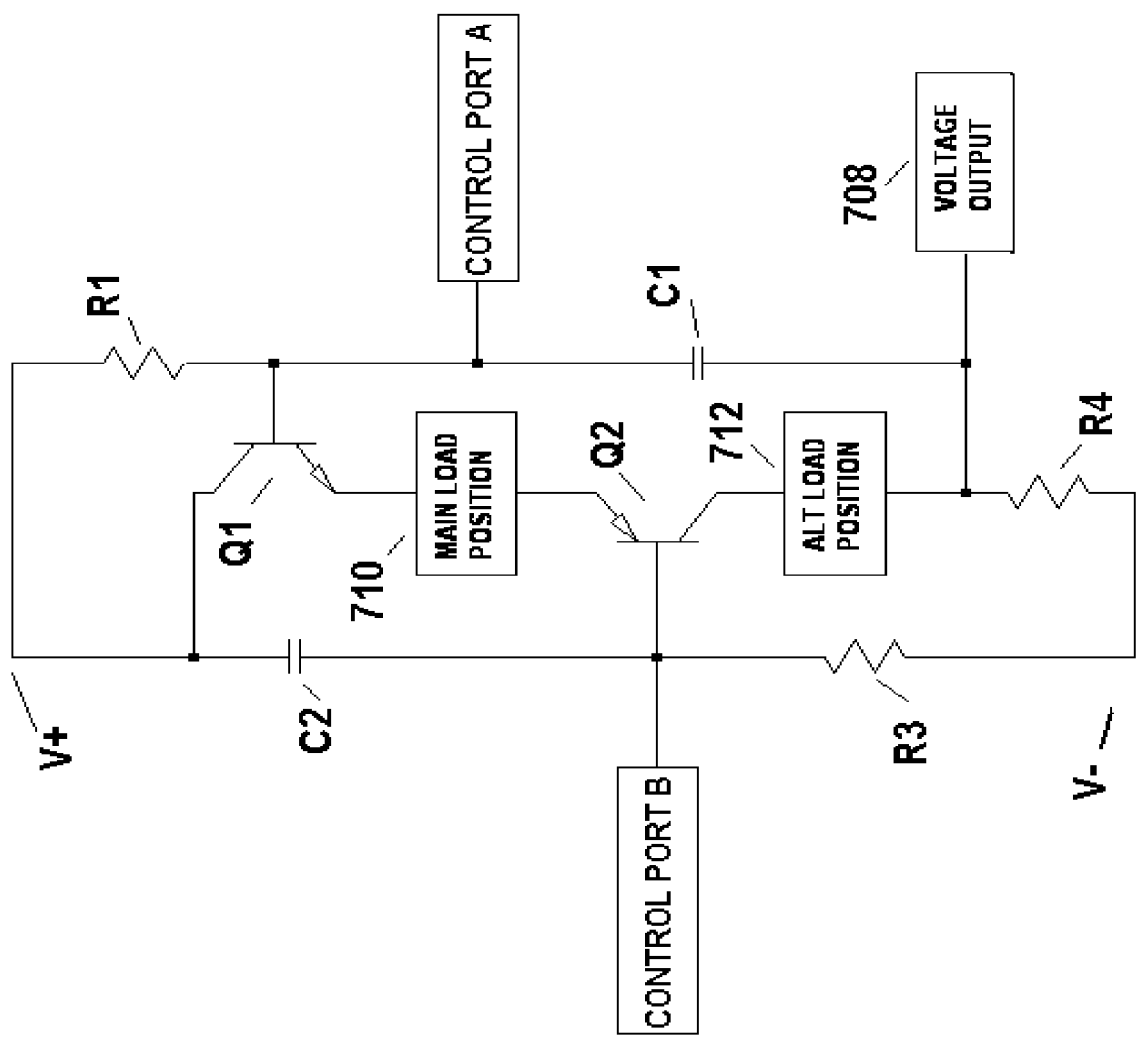
FIG. 7 is a generalized schematic circuit diagram of a pulse generator according to certain other embodiments of the invention.

FIG. 7 is a generalized schematic circuit diagram of a circuit 700 according to certain other embodiments of the invention. Instead of the voltage output 608 being tied to the positive power supply rail V+ via resistor R2 as in the circuit 600 of FIG. 6A, in the circuit 700 of FIG. 7, the voltage output 708 is tied to the negative power supply rail V− (e.g., ground) via resistor R4. As such, the circuit 700 is an inversion of the circuit 600 of FIG. 6A. In particular, the output voltage 708 now becomes a positive-going voltage when the circuit 700 triggers, instead of the negative-going output voltage 608 of FIG. 6A (e.g., the timing signal DPGV in FIGS. 2 and 3). The output current pulse (at either load position 710 or 712) is essentially identical to the corresponding output current pulse generated by the circuit 600 of FIG. 6A. The alternative positions for the load 710 and 712 and for the control ports A-D correspond to the alternative positions shown in FIG. 6A.

Figure 9:
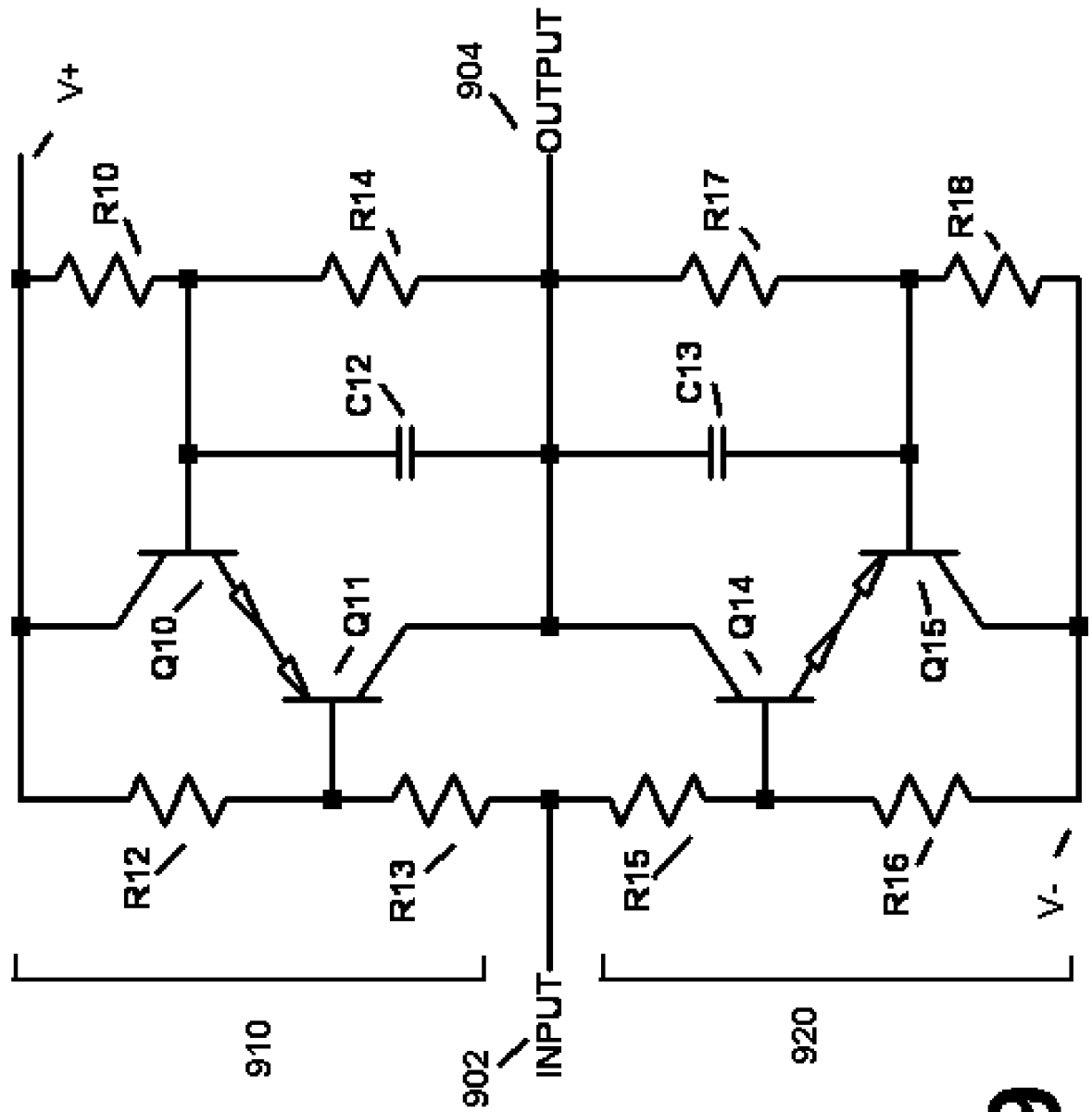
FIG. 9 is a schematic circuit diagram of a hysteretic buffer formed from a complementary pair of pulse generators, according to certain embodiments of the invention.
Figure 10:
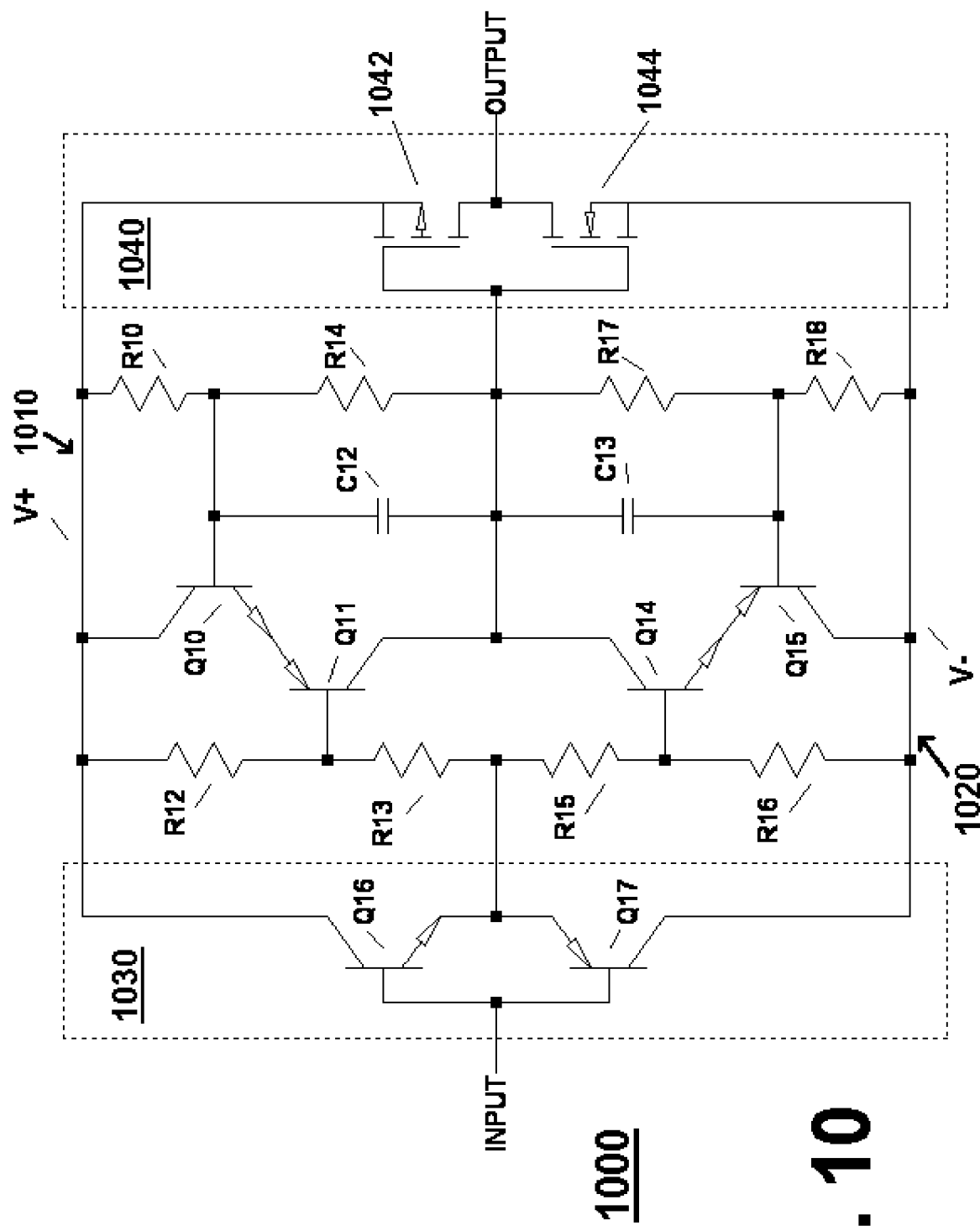
FIG. 10 is a schematic circuit diagram of a hysteretic buffer with optional input and output buffering.
Figure 12:
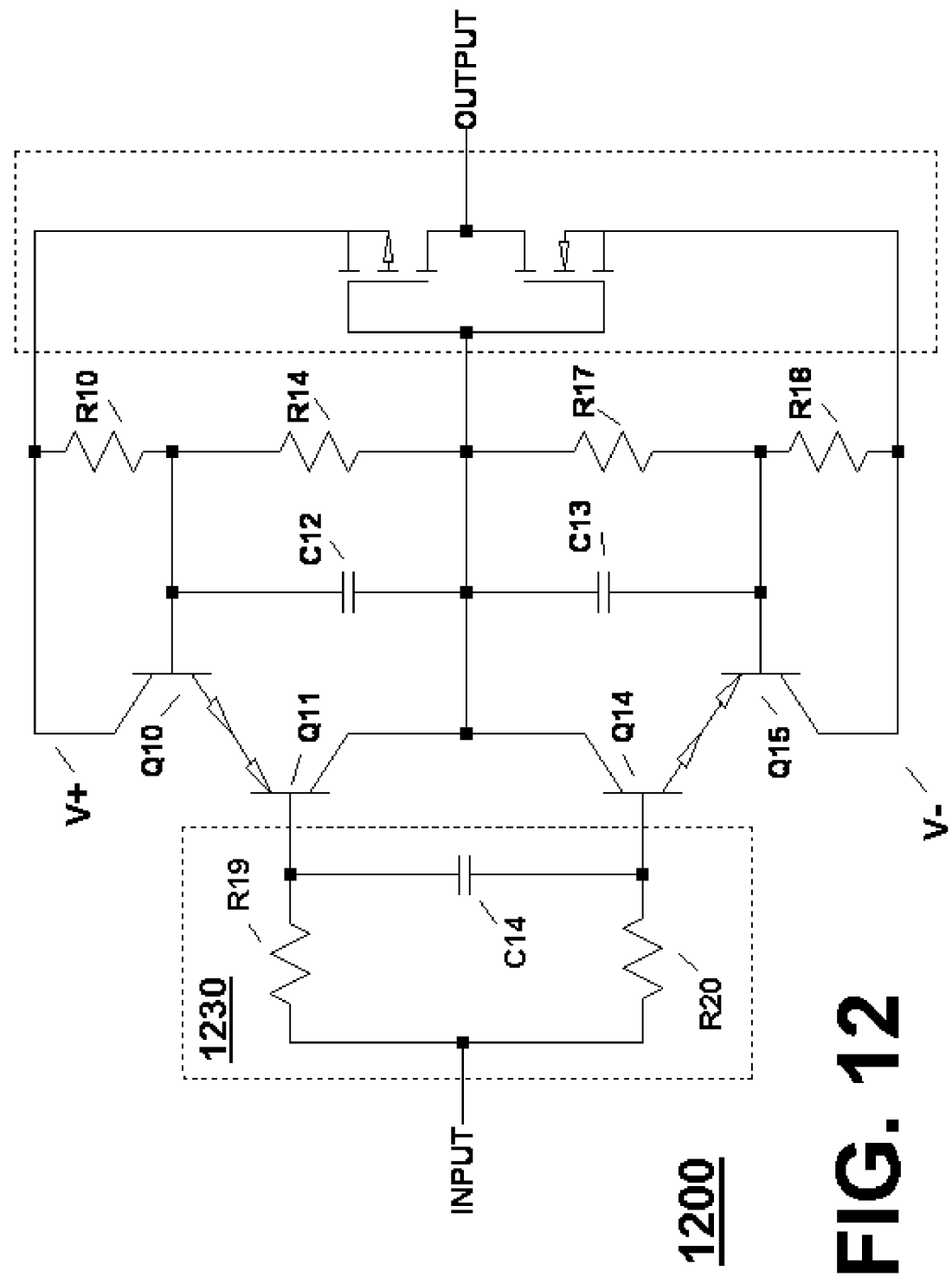
FIG. 12 is a schematic circuit diagram of a hysteretic buffer with alternative input structure.

In FIG. 7, capacitors C1 and C2 can exchange functions compared to FIG. 6A, depending on the control inputs. Alternatively, capacitor C1 or C2 could be replaced by a resistor for monostable operation such as is shown in FIGS. 9, 10, and 12. In addition, FETS can replace either or both bipolar transistors.

Possible sources for the control signals applied at the control ports A and B for the circuit 700 of FIG. 7 include zero-crossing detectors and sensors for temperature, pressure, motion, light, ionization, and radiation, among others.

Figure 8:
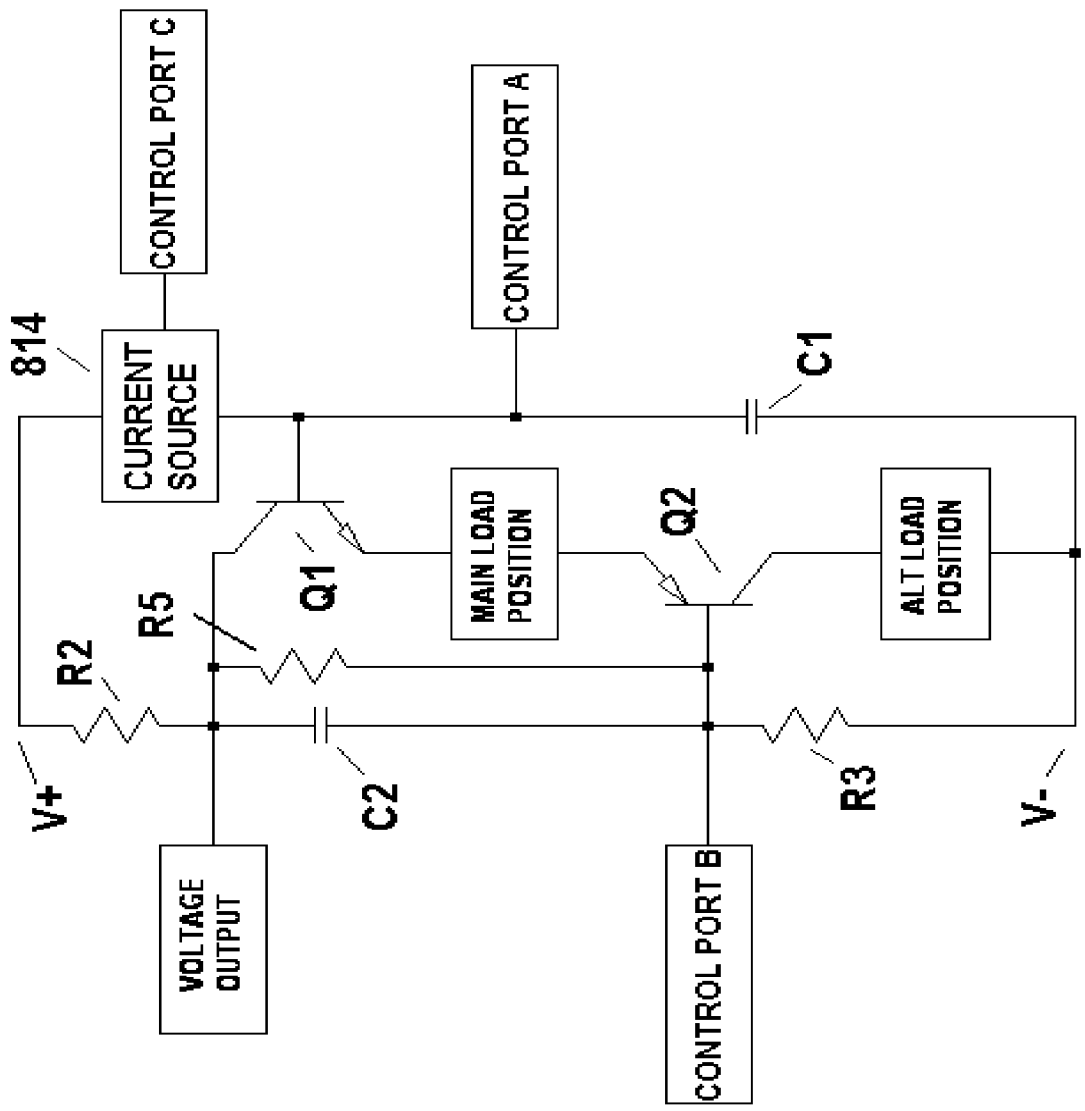
FIG. 8 is a generalized schematic circuit diagram of a pulse generator according to certain other embodiments of the invention.

FIG. 8 is a generalized schematic circuit diagram of a circuit 800 according to certain other embodiments of the invention. Instead of being charged via the timing resistor R1 of FIG. 6A, the timing capacitor C1 is charged from a current source 814 controlled at control port C. The charging by the current source 814 linearizes the rising voltage on the timing capacitor C1, thereby enabling more-accurate timing. The current source 814 can be modulated or turned completely off at the control port C.

Instead of robbing charging current through transistor Q3 of FIG. 2, to stop the generation of pulses, when the charging current from the current source 814 is shut off at the control port C, the minimum power required by the circuit 800 can drop to near zero. In order to set a DC operating point for the base of transistor Q2 under those steady-state conditions, a bias resistor R5 has been added in FIG. 8. The bias resistor R5 will draw current even when there are no pulses being generated, but that current can be vanishingly small.

With some or all of these refinements, the circuit 800 can operate over an extremely wide range of frequencies, from sub one Hertz rates to over 10 Megahertz using ordinary transistors, all while consuming a fraction of the power required by prior-art pulse generators.

A signal transformer is intrinsically bidirectional. The secondary winding of the signal transformer T2 could be the load in a second demand pulse generator. Then, pulse detectors could operate on both windings of transformer T2, one on each side of the isolation barrier. In this fashion, the pulse generator could be made bidirectional. That capability could be useful for a bidirectional power converter or for other isolated circuits.

It will be evident to those skilled in the art that other versions of the pulse generator are possible. Current direction or voltage polarity can be reversed, possibly including the exchange of n-type for p-type switching devices and vice versa. For even faster switching, GAAS, GaN, SiC, or other high electron mobility transistor (HEMT) switches can be substituted. A positive and a negative version of the pulse generator could be paired, responding hysteretically to the same input signal to form a fast-acting, ultra-low-power logic buffer.

FIG. 9 is a schematic circuit diagram of a hysteretic buffer 900 formed from a complementary pair of pulse generators 910 and 920, according to certain embodiments of the invention. In low-power circuitry, a slowly changing signal falling between a logic high level and a logic low level and connected to a logic input will cause currents to be drawn far in excess of currents drawn when an input is at a logic high or logic low level. In a power converter, such slowly changing signals could, for example, include comparator outputs or error amplifier outputs. With low-power, limited-bandwidth circuits, such signals tend to spend considerable time in transition. Those slow transitions waste power in logic circuitry. Similar inefficiencies are an issue in other devices, including battery-powered devices, IoT devices, and always-on standby circuits in computers, TVs, appliances, etc.

The buffer 900 of FIG. 9 draws only a small current even as the input voltage 902 approaches a threshold point. When the buffer 900 switches state, the state transitions rapidly, so that downstream logic can operate more efficiently. The hysteretic buffer 900 might have three regions of operation: zero to ⅓ of the power supply voltage 9D (corresponding to logic low), ⅓ to ⅔ of the power supply voltage (corresponding to an indeterminate logic state), and above ⅔ of the power supply voltage (corresponding to logic high). The buffer 900 is inverting, though non-inverting forms will be apparent to those skilled in the art.

The upper half 910 of the buffer 900 is a version of the generalized circuit 600 of FIG. 6A, where elements Q10, Q11, R10, R12, R13, and C12 of FIG. 9 are respectively analogous to elements Q1, Q2, R1, R2, R3, and C2 of FIG. 6A. The upper half 910 is triggered by the input 902 falling below a threshold voltage, in this example, approximately ⅓ of the supply voltage 9D. When the upper half 910 is triggered, the output 9D is pulled sharply upward by Q10 and Q11 as they generate a positive current pulse.

The lower half 920 of the circuit (i.e., elements Q14, Q15, R15-R18, and C13) is a second circuit mirrored in complementary form, triggered by the input 902 rising above a second threshold voltage, here approximately ⅔ of the supply voltage. The two halves 910 and 920, working in alternation, cause the output 904 to be an inverted digital representation of the input 902 with ⅓ of the power supply voltage as hysteresis. The buffer 900 of FIG. 9 draws a pulse of current at each digital edge of the output 904, but draws a minimum amount of current while in either logic state, even while the input 902 is in the indeterminate middle ⅓ of the voltage range. By adjusting component values, the trade-off between output slew rate and quiescent power can be set as desired. For example, 1-microsecond transitions require about 10 microwatts of quiescent power. The threshold voltages for the hysteretic operation can be set as desired by adjusting resistor ratios.

Resistors R12 and R13, in combination with resistors R10 and R14, set a threshold voltage for the positive-going output edge. Capacitor C12 provides positive feedback to speed the positive edge. Resistors R15 and R16, in combination with resistors R17 and R18, set a threshold voltage for the negative-going output edge. Capacitor C13 provides positive feedback to speed the negative edge. Just a few picofarads of capacitance is necessary, so the capacitors C12 and C13 can be built into an integrated circuit. The lower half 920 of the buffer 900 pulls down hard when the input 902 rises above the positive-going threshold voltage.

FIG. 10 is a schematic circuit diagram of a hysteretic buffer 1000 according to certain other embodiments of the invention. Buffer 1000 is the same as buffer 900 of FIG. 9 with the addition of an optional input buffer 1030 comprising complementary bipolar transistors Q16 and Q17 and an optional output buffer 1040 comprising complementary FET transistors 1042 and 1044. Note that the two input transistors Q16 and Q17 could be FETs for even lower input currents. The emitters of the two transistors Q16 and Q17 can be connected to different points in the resistive divider formed by resistors R12, R13, R15, and R16 to provide additional freedom when selecting hysteretic threshold voltages. Also, the complementary pulse generators 910/920 and 1010/1020 in FIGS. 9 and 10, respectively, could be made with FETs instead of bipolar transistors, as in FIG. 4, if FETs are preferred. Optional input buffer 1030 and/or optional output buffer 1040 can be added to increase input impedance or reduce output impedance, as desired.

Figure 11:
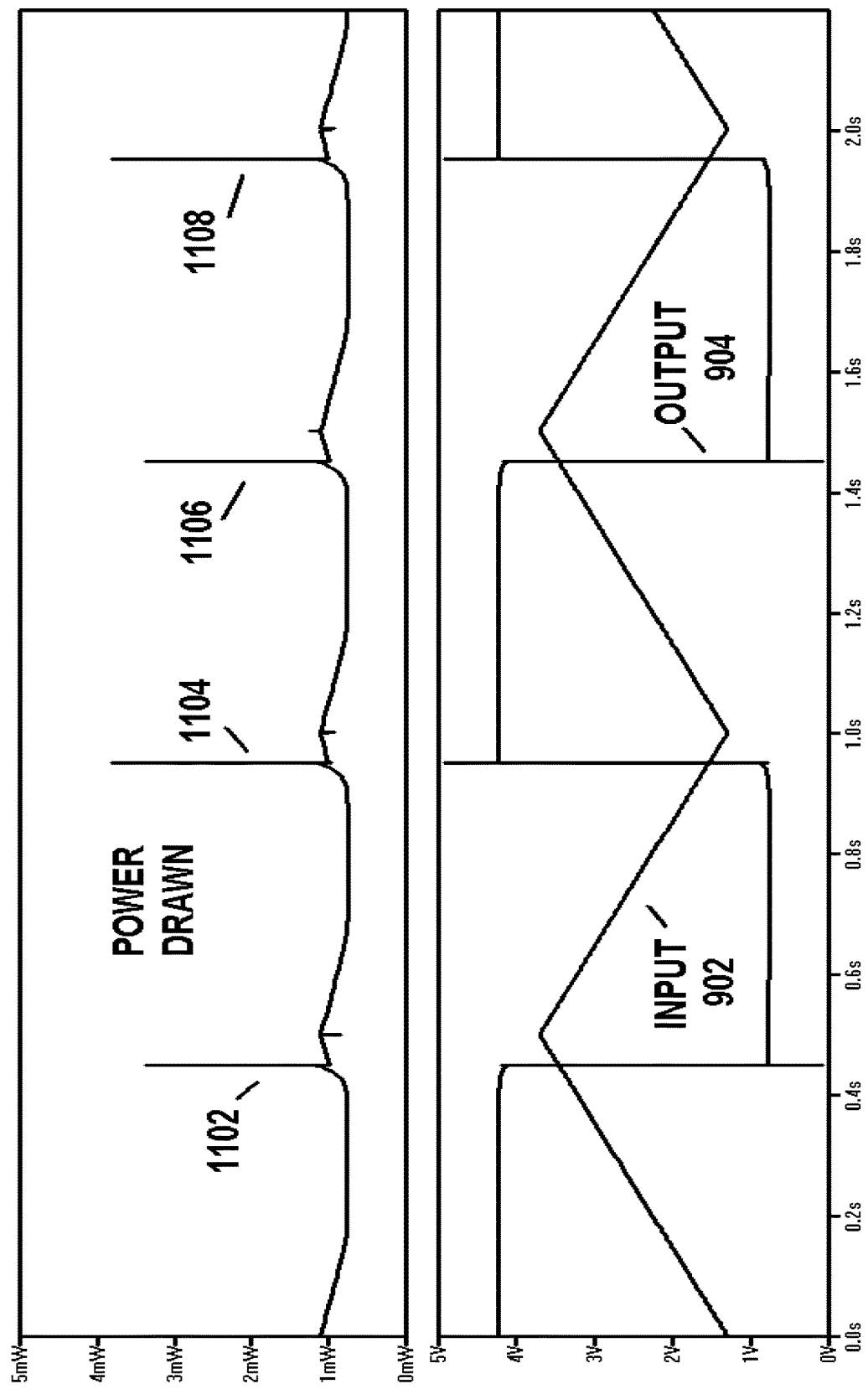
FIG. 11 shows simulated SPICE waveforms simulated for a medium speed version of the hysteretic buffer of FIG. 9 for upper and lower voltage rails at 5V and 0V, respectively.

FIG. 11 shows simulated SPICE waveforms for a medium speed version of the hysteretic buffer 900 of FIG. 9 for upper and lower voltage rails at 5V and 0V, respectively. The upper graph shows power drawn by the buffer 900, and the lower graph shows the input and output voltages 902 and 904. In this particular example, the input voltage 902 is a 1 Hertz triangle wave that dwells most of the time between the upper and lower threshold voltages of approximately 3.3V and 1.7V, respectively. The output voltage 904 is a logic level with about 26-nanosecond transition times. At 0.45 seconds elapsed time, the input voltage 902 rises above the 3.3V upper threshold voltage, triggering a negative current pulse (represented by power spike 1102), in turn causing a negative transition in the output voltage 904. At 0.95 seconds elapsed time, the input voltage 902 falls below the 1.7V lower threshold voltage, triggering a positive current pulse (represented by power spike 1104), which causes a positive transition in the output voltage 904. Again, the hysteresis threshold voltages can be set as desired by changing resistor ratios, and the switching speed can be controlled by changing total impedances or by changing capacitor values. Some minimum amount of hysteresis prevents both pulse generators 910 and 920 from acting simultaneously, which would cause excess current to flow.

The average power drawn in this example is about 860 microwatts. The pulses generated by the actions of the two complementary pulse generators 910 and 920 correspond to the power spikes 1102-1108 shown in the upper trace of FIG. 11. With higher-impedance resistors, the average power drawn can be reduced below 10 microwatts while still achieving 1-microsecond output transitions. At higher average power, transitions of a few nanoseconds are possible.

Two instances of the hysteretic inverting buffer 900 can be connected in series to form a non-inverting buffer. That arrangement entails a small amount of additional delay from input to output, but such delay rarely is of concern in circuits with very slowly changing inputs. The output of the second inverting buffer will transition even faster in the non-inverting form, so the extra power consumed by the second buffer may be more than saved through the reduction of power consumed by downstream digital circuitry.

Alternatively, the second inversion could be provided by a power driver stage suitable for directly driving power FETs or other solid state switches. Such an output stage is shown as optional output buffer 1040 in FIG. 10. That arrangement could reduce switching losses by minimizing time spent in transition between on and off, or off and on. As known in the art, a buffer outputs relatively low-power logic levels for downstream digital circuitry, while the output generated by a power driver stage would typically have orders of magnitude more current.

FIG. 12 shows an alternative input structure 1230 for a hysteretic buffer 1200. Resistors R19 and R20, in combination with capacitor C14, induce a slight delay in the response at the bases of the transistors Q11 and Q14. That delay insures that the transistor pair Q11 and Q14 turns all the way off, instead of tending toward a linear operating point One application of the buffers of FIG. 9, 10, or 12 would be to condition the clock input of a clocked bistable. These devices, as generally provided, specify a maximum clock transition time. Indeterminate behavior can occur with slower clock edges. In addition, slow clock edges drastically increase the power consumption. With the addition of the buffer 1000 of FIG. 10 on the clock input, the bistable can operate properly and efficiently with arbitrarily long clock transition times. If only one clock edge is critical, then an edge accelerator based on a single trigger circuit such as shown in FIG. 6A, 7, or 8 might suffice.

The power converter 100 of FIG. 1 can be implemented using two integrated circuits: a primary-side die that implements the circuitry on the primary side 110 of the power and signal transformers T1 and T2 and a secondary-side die that implements the circuitry on the secondary side 130 of the power and signal transformers T1 and T2. The transformers T1 and T2 can be implemented using discrete elements. In some implementations, the signal transformer can be implemented using lead frame structure as described in U.S. Pat. No. 8,818,296, the teachings of which are incorporated herein by reference. In some implementations, diode D1 and/or switch S1 (if present) might also be implemented as discrete elements. In some implementations, the secondary-side die can implement additional, digital circuitry, for example, to modify the behavior of the power converter according to USB-PD or Quick Charge™ protocols. In some alternative embodiments, as taught in the '152 patent, a single transformer functions as both the power and signal transformers T1 and T2.

The circuits of FIGS. 2 and 4-10 provide different circuit-level functions. As described previously, the circuits 144 of FIGS. 2 and 4-5 can be controlled to operate as demand pulse generators in isolated power converters, the circuits 600, 700, and 800 of FIGS. 6, 7, and 8 can be controlled to operate as either oscillating current pulse generators or as trigger devices, and the circuits 900 and 1000 of FIGS. 9 and 10 can be controlled to operate as hysteretic buffers. What all of these different circuits have in common is trigger circuitry comprising (i) two series-connected transistors of opposite type that turn on together when the voltage at the base/gate of the n-type device exceeds the voltage at the base/gate of the p-type device by at least the sum of the turn-on threshold voltages of the two transistors. The transistors turn off together when the voltage across the two transistors drops and (ii) a positive-feedback capacitor that ensures that the two transistors turn on and off together quickly and securely.

Referring to the demand pulse generator 144 of FIG. 2, the trigger circuitry comprises the n-type transistor Q1, the p-type transistor Q2, and the positive-feedback capacitor C2. The collector and emitter of the transistor Q1 are connected in series with the collector and emitter of the transistor Q2 such that, when the two transistors are turned on, current flows from the emitter of the n-type transistor Q1 to the emitter of the p-type transistor Q2. The positive-feedback capacitor C2 is connected between the collector of the n-type transistor Q1 and the base of the p-type transistor Q2. The two transistors are turned on when the voltage at the base of the n-type transistor Q1 exceeds the voltage at the base of the p-type transistor Q2 by at least the sum of the turn-on threshold voltages of the two transistors. The voltage across the positive-feedback capacitor C2 ensures that both transistors are turned on quickly and securely. When the two transistors are triggered, the current flowing from the collector of transistor Q1 to the collector of transistor Q2 quickly drains the timing capacitor C1 and causes the voltage at the base of the n-type transistor Q1 not to exceed the voltage at the base of the p-type transistor Q2 by at least the sum of the turn-on threshold voltages of the two transistors, which causes the two transistors Q1 and Q2 to turn off together. Here, too, the voltage across the positive-feedback capacitor C2 ensures that both transistors Q1 and Q2 are turned off quickly and securely.

The analogous trigger circuitry of transistors Q1 and Q2 and positive-feedback capacitor C2 in each of circuits of FIGS. 6-8 can be similarly described. The corresponding trigger circuitry in each of the circuits of FIGS. 4-5 can be analogously described, albeit for the FET transistors M1 and M2 instead of the bipolar transistors Q1 and Q2 of FIG. 2.

The hysteretic buffers of FIGS. 9 and 10 have two sets of trigger circuitry: a first set comprising transistors Q10 and Q11 and capacitor C12 and a second set comprising transistors Q14 and Q15 and capacitor C13. For the first set of trigger circuitry, the collector and emitter of the transistor Q10 are connected in series with the collector and emitter of the transistor Q11 such that, when the two transistors are turned on, current flows from the emitter of the n-type transistor Q10 to the emitter of the p-type transistor Q11. The positive-feedback capacitor C12 is connected between the collector of the p-type transistor Q11 and the base of the n-type transistor Q10. The two transistors are turned on when the voltage at the base of the n-type transistor Q10 exceeds the voltage at the base of the p-type transistor Q11 by at least the sum of the turn-on threshold voltages of the two transistors. The voltage across the positive-feedback capacitor C12 ensures that both transistors are turned on quickly and securely. When the two transistors are triggered, current flows from the collector of transistor Q10 to the collector of transistor Q11, which causes the voltage at the base of the n-type transistor Q10 not to exceed the voltage at the base of the p-type transistor Q11 by at least the sum of the turn-on threshold voltages of the two transistors, which causes the two transistors Q10 and Q11 to turn off together. Here, the voltage across the positive-feedback capacitor C12 ensures that both transistors Q10 and Q11 are turned off quickly and securely.

For the second set of trigger circuitry of FIGS. 9 and 10, the collector and emitter of the transistor Q14 are connected in series with the collector and emitter of the transistor Q15 such that, when the two transistors are turned on, current flows from the emitter of the n-type transistor Q14 to the emitter of the p-type transistor Q15. The positive-feedback capacitor C13 is connected between the collector of the n-type transistor Q14 and the base of the p-type transistor Q15. The two transistors are turned on when the voltage at the base of the n-type transistor Q14 exceeds the voltage at the base of the p-type transistor Q15 by at least the sum of the turn-on threshold voltages of the two transistors. The voltage across the positive-feedback capacitor C13 ensures that both transistors are turned on quickly and securely. When the two transistors are triggered, current flows from the collector of transistor Q14 to the collector of transistor Q15, which causes the voltage at the base of the n-type transistor Q14 not to exceed the voltage at the base of the p-type transistor Q15 by at least the sum of the turn-on threshold voltages of the two transistors, which causes the two transistors Q14 and Q15 to turn off together. Here, the voltage across the positive-feedback capacitor C13 ensures that both transistors Q14 and Q15 are turned off quickly and securely.

In certain embodiments, circuitry comprises a trigger circuit. The trigger circuit comprises an n-type transistor (e.g., Q1, Q10, Q14) having a base, a collector, and an emitter and characterized by a turn-on threshold voltage; a p-type transistor (e.g., Q2, Q12, Q15) having a base, a collector, and an emitter and characterized by a turn-on threshold voltage, wherein the collector and emitter of the n-type transistor are connected in series with the collector and emitter of the p-type transistor such that, when the two transistors are turned on, current flows from the collector of the n-type transistor to the collector of the p-type transistor; and a positive-feedback capacitor (e.g., C1, C2, C12, C13) connected between the collector of a first (e.g., Q2, Q1, Q11, Q14) of the two transistors and the base of a second (e.g., Q1, Q2, Q10, Q15) of the two transistors. The trigger circuit is configured such that (i) the two transistors turn on together when the voltage at the base of the n-type transistor exceeds the voltage at the base of the p-type transistor by at least the sum of the turn-on threshold voltages of the two transistors and (i) the two transistors turn off together when the voltage at the base of the n-type transistor fails to exceed the voltage at the base of the p-type transistor by at least the sum of the turn-on threshold voltages of the two transistors. The positive-feedback capacitor ensures that the two transistors turn fully on and off together.

In certain embodiments of the foregoing, the two transistors are bipolar transistors (e.g., Q1/Q2, Q10/Q11, Q14/Q15) or field-effect transistors (e.g., M1/M2).

In certain embodiments of the foregoing, the first transistor is the n-type transistor (e.g., Q1, M1, Q14); the second transistor is the p-type transistor (e.g., Q2, M2, Q15); and the positive-feedback capacitor (e.g., C2, C13) is connected between the collector of the n-type transistor and the base of the p-type transistor.

In certain embodiments of the foregoing, the circuitry further comprises a timing capacitor (e.g., C1) connected to the base of the n-type transistor and configured to be charged when the two transistors are off and discharged when the two transistors are on. The charging of the timing capacitor causes the two transistors to turn on, and the discharging of the timing capacitor contributes to a current pulse through the two transistors.

In certain embodiments of the foregoing, the first transistor is the p-type transistor (e.g., Q2, Q11); the second transistor is the n-type transistor (e.g., Q1, Q10); and the positive-feedback capacitor (e.g., C1, C12) is connected between the collector of the p-type transistor and the base of the n-type transistor.

In certain embodiments of the foregoing, wherein the circuitry further comprises a timing capacitor (e.g., C2) connected to the base of the p-type transistor (e.g., Q2) and configured to be charged when the two transistors are off and discharged when the two transistors are on. The charging of the timing capacitor causes the two transistors to turn on, and the discharging of the timing capacitor contributes to a current pulse through the two transistors.

In certain embodiments of the foregoing, an output load (e.g., 610) is connected in series between the emitter of the n-type transistor and the emitter of the p-type transistor.

In certain embodiments of the foregoing, the output load comprises a transformer winding (e.g., 134).

In certain embodiments of the foregoing, the output load further comprises a switch (e.g., S2) connected in series with a catch diode (e.g., D4); the switch and the catch diode are connected in parallel with the transformer winding; and the switch is configured to be selectively controlled to transmit data via the transformer winding.

In certain embodiments of the foregoing, an output load (e.g., 612) is connected in series between the collector of the p-type transistor and a low-voltage supply rail (e.g., V−) of the circuitry.

In certain embodiments of the foregoing, an output load is connected in series between the collector of the n-type transistor and a high-voltage supply rail (e.g., V+) of the circuitry.

In certain embodiments of the foregoing, the emitter of the n-type transistor is directly connected to the emitter of the p-type transistor.

In certain embodiments of the foregoing, the trigger circuit is part of a pulse generator configured to generate current pulses corresponding to the current flowing from the collector of the n-type transistor to the collector of the p-type transistor.

In certain embodiments of the foregoing, the pulse generator is a controlled pulse generator configured to receive a control signal that controls frequency of the current pulses.

In certain embodiments of the foregoing, the pulse generator is a demand pulse generator (e.g., 144) on the secondary side of an isolated power converter.

In certain embodiments of the foregoing, the circuitry comprises the isolated power converter configurable to drive an output load.

In certain embodiments of the foregoing, the circuitry comprises the output load.

In certain embodiments of the foregoing, the trigger circuit is part of an oscillator that oscillates with the two transistors repeatedly turning on and off together.

In certain embodiments of the foregoing, the oscillator is a controlled oscillator configured to receive a control signal that controls frequency of the oscillation.

In certain embodiments of the foregoing, the trigger circuit is part of a delay circuit that receives an input signal and generates a delayed output signal when the two transistors turn on together.

In certain embodiments of the foregoing, the delay circuit is a controlled delay circuit configured to receive a control signal that controls magnitude of the delay between the input signal and the delayed output signal.

In certain embodiments of the foregoing, the trigger circuit is part of an edge accelerator that receives an input signal having an input leading edge with an input transition time and generates, when the two transistors turn on together, an output signal having an output leading edge with an output transition time that is shorter than the input transition time.

In certain embodiments of the foregoing, the edge accelerator is a buffer (e.g., 900) comprising the trigger circuit (e.g., Q10, Q11, C12) connected in parallel with a complementary version of the trigger circuit (e.g., Q14, Q15, C13). When the buffer receives a first input signal, the two transistors (e.g., Q10/Q11) of the trigger circuit turn on together and the buffer generates an output signal having a first logical value. When the buffer receives a second input signal, the two transistors (e.g., Q14/Q15) of the complementary version of the trigger circuit turn on together and the buffer generates the output signal having a second logical value.

Embodiments of the invention may be implemented as (analog, digital, or a hybrid of both analog and digital) circuit-based processes, including possible implementation as a single integrated circuit (such as an ASIC or an FPGA), a multi-chip module, a single card, or a multi-card circuit pack.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals, voltages, or currents and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the terms "emitter," "collector," and "base" should be understood to refer respectively either to the emitter, collector, and base of a bi-polar device or to the source, drain, and gate of a FET device if an embodiment of the invention is implemented using FET transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

All documents mentioned herein are hereby incorporated by reference in their entirety or alternatively to provide the disclosure for which they were specifically relied upon.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

What is claimed is:

1. An article of manufacture comprising a flyback converter, the flyback converter comprising:
   a primary side comprising an input port;
   a secondary side comprising an output port, wherein the secondary side is galvanically isolated from the primary side; and
   a power transformer configured to transfer input power received at the input port to provide output power at the output port, wherein:
   the primary side further comprises a primary-side switch configured to selectively enable the input power at the input port to be transferred via the power transformer to the output power at the output port;
   the secondary side further comprises a demand pulse generator that (i) determines when to turn on the primary-side switch based on output voltage or output current at the output port and (ii) generates corresponding demand pulses;
   the primary side comprises a primary-side magnetically coupled conductor;
   the secondary side comprises a secondary-side magnetically coupled conductor configured to be magnetically coupled to the primary-side magnetically coupled conductor to convey the demand pulses from the secondary side to the primary side;
   the primary-side switch is turned on in response to a demand pulse conveyed from the secondary side to the primary side;
   the demand pulse generator comprises:
      an n-type transistor having a base, a collector, and an emitter and characterized by a turn-on threshold voltage;
      a p-type transistor having a base, a collector, and an emitter and characterized by a turn-on threshold voltage, wherein the collector and emitter of the n-type transistor are connected in series with the collector and emitter of the p-type transistor such that, when the two transistors are turned on, current flows from the collector of the n-type transistor to the collector of the p-type transistor; and
      a positive-feedback capacitor connected between the collector of a first of the two transistors and the base of a second of the two transistors, wherein:
      the demand pulse generator is configured such that
      (i) the two transistors turn on together when the voltage at the base of the n-type transistor exceeds the voltage at the base of the p-type transistor by at least the sum of the turn-on threshold voltages of the two transistors and (i) the two transistors turn off together when the voltage at the base of the n-type transistor fails to exceed the voltage at the base of the p-type transistor by at least the sum of the turn-on threshold voltages of the two transistors; and the positive-feedback capacitor ensures that the two transistors turn fully on and off together.

2. The article of claim 1, wherein the primary side further comprises:
a demand pulse detector connected to the primary-side magnetically coupled conductor; and
a switch driver connected to the demand pulse detector and the primary-side switch, wherein:
the demand pulse detector detects a demand pulse transmitted from the secondary side via the secondary- and primary-side magnetically coupled conductors to the primary side; and
the switch driver turns on the primary-side switch based on the detection of the demand pulse by the demand pulse detector.

3. The article of claim 1, wherein:
when the output port is in regulation, the determination of when to turn off the primary-side switch is originated on the primary side;
frequency with which the primary-side switch is turned on is based on the demand pulses conveyed from the secondary side to the primary side to regulate the output voltage or the output current at the output port; and
the demand pulse generator is at least partially powered using energy transferred to the secondary side during forward power converter pulses of the flyback converter.

4. The article of claim 1, wherein the two transistors are bipolar transistors or field-effect transistors.

5. The article of claim 1, wherein:
the first transistor is the n-type transistor;
the second transistor is the p-type transistor; and
the positive-feedback capacitor is connected between the collector of the n-type transistor and the base of the p-type transistor.

6. The article of claim 5, further comprising a timing capacitor connected to the base of the n-type transistor and configured to be charged when the two transistors are off and discharged when the two transistors are on, wherein:
the charging of the timing capacitor causes the two transistors to turn on; and
the discharging of the timing capacitor contributes to a current pulse through the two transistors.

7. The article of claim 1, wherein:
the first transistor is the p-type transistor;
the second transistor is the n-type transistor; and
the positive-feedback capacitor is connected between the collector of the p-type transistor and the base of the n-type transistor.

8. The article of claim 7, further comprising a timing capacitor connected to the base of the p-type transistor and configured to be charged when the two transistors are off and discharged when the two transistors are on, wherein:
the charging of the timing capacitor causes the two transistors to turn on; and
the discharging of the timing capacitor contributes to a current pulse through the two transistors.

9. The article of claim 1, wherein the secondary-side magnetically coupled conductor is connected in series between the emitter of the n-type transistor and the emitter of the p-type transistor.

10. The article of claim 9, wherein a catch diode is connected in parallel with the secondary-side magnetically coupled conductor between the emitter of the n-type transistor and the emitter of the p-type transistor.

11. The article of claim 9, wherein:
a secondary-side switch is connected in series with a catch diode;
the secondary-side switch and the catch diode are connected in parallel with the secondary-side magnetically coupled conductor between the emitter of the n-type transistor and the emitter of the p-type transistor;
the primary side further comprises a data state detector connected to the primary-side magnetically coupled conductor;
the secondary-side switch is controllable to transmit data from the secondary side via the secondary- and primary-side magnetically coupled conductors to the primary side; and
the data state detector detects the transmitted data.

12. The article of claim 1, further comprising an output load connected to the output port.

13. The article of claim 1, wherein the secondary side further comprises synchronous rectification circuitry 148 that performs synchronous rectification for the flyback converter based on a control voltage received from the demand pulse generator.

14. The article of claim 13, wherein the control voltage is at the collector of the n-type transistor.

* * * * *